(12) United States Patent
Dawe et al.

(10) Patent No.: US 7,982,527 B2
(45) Date of Patent: Jul. 19, 2011

(54) RECONFIGURABLE MIXER WITH GAIN CONTROL

(75) Inventors: Geoffrey C. Dawe, Newburyport, MA (US); Krenar Komoni, Acton, MA (US)

(73) Assignee: BitWave Semiconductor, Inc., Lowell, MA (US)

( * ) Notice: Subject to any disclaimer, the term of this patent is extended or adjusted under 35 U.S.C. 154(b) by 0 days.

(21) Appl. No.: 12/348,606

(22) Filed: Jan. 5, 2009

(65) Prior Publication Data
US 2010/0171542 A1 Jul. 8, 2010

(51) Int. Cl.
*G06G 7/12* (2006.01)
(52) U.S. Cl. .......................... 327/355; 327/350
(58) Field of Classification Search .................. 327/350, 327/354–361; 455/320, 333
See application file for complete search history.

(56) References Cited

U.S. PATENT DOCUMENTS

| | | | |
|---|---|---|---|
| 7,124,221 B1 * | 10/2006 | Zerbe et al. | 710/106 |
| 7,323,945 B2 | 1/2008 | Cyr et al. | |
| 7,482,887 B2 | 1/2009 | Cyr et al. | |
| 7,508,898 B2 | 3/2009 | Cyr et al. | |
| 7,580,684 B2 | 8/2009 | Cyr et al. | |
| 7,672,645 B2 | 3/2010 | Kilpatrick et al. | |
| 2005/0164669 A1 * | 7/2005 | Molnar et al. | 455/320 |

* cited by examiner

*Primary Examiner* — Lincoln Donovan
*Assistant Examiner* — Diana J Cheng
(74) *Attorney, Agent, or Firm* — Lando & Anastasi, LLP

(57) ABSTRACT

A frequency mixer or modulator circuit that is reconfigurable through electronic programming among active and passive operation, and/or harmonic and sub-harmonic operation, and/or up-conversion and down-conversion, and/or no-overlap, off-overlap, and on-overlap mixing, and/or upper-sideband modulation and lower-sideband modulation. In one example, the frequency mixer or modulator circuit also includes automatic gain control.

6 Claims, 26 Drawing Sheets

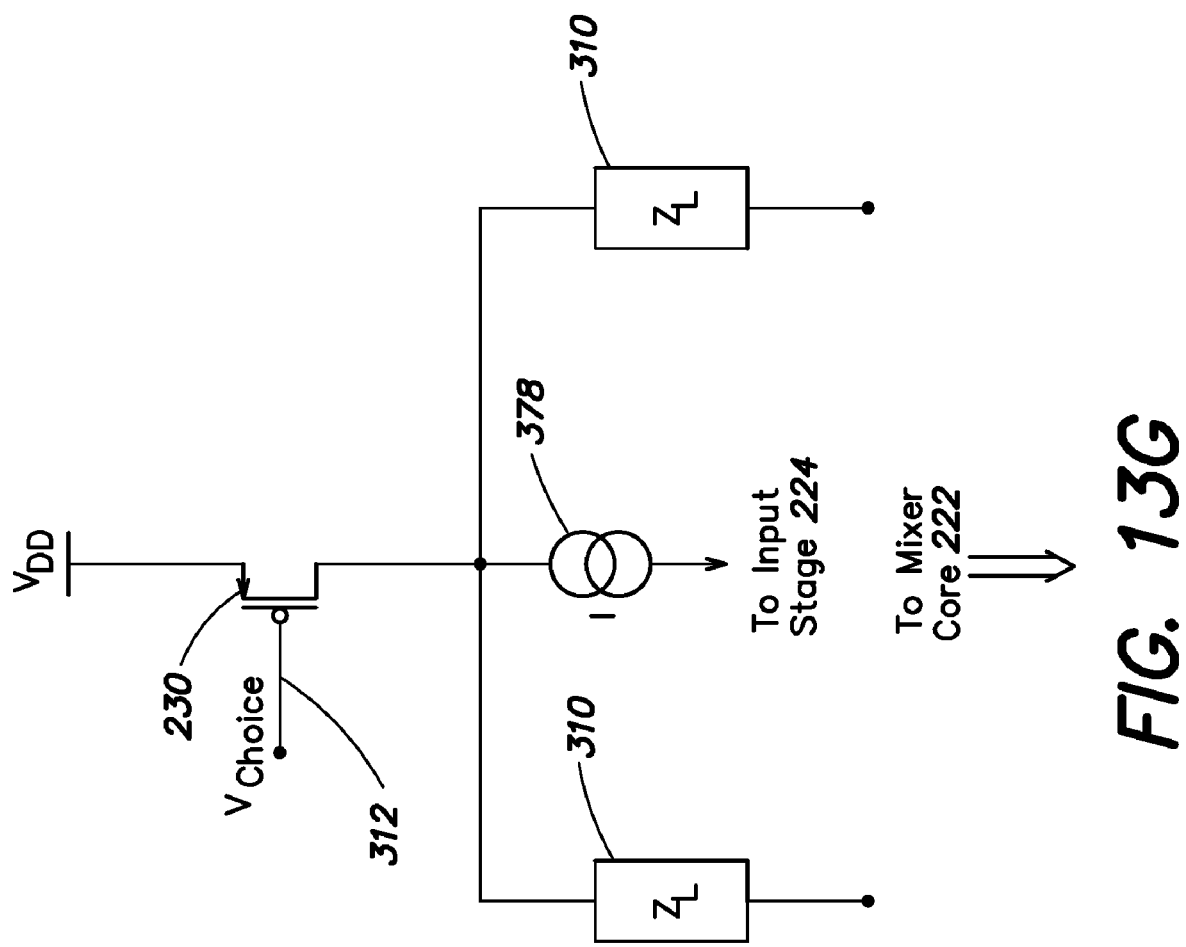

RECONFIGURABLE MIXER WITH GAIN CONTROL

BACKGROUND

1. Field of Invention

The present invention relates generally to the field of wireless transceiver systems and, more particularly, to electronic circuits, such as mixers, used in wireless transceiver systems.

2. Discussion of Related Art

A mixer is a device that performs frequency translation by mixing two signals (and possibly their harmonics). The process of mixing the two signals leads to down-conversion or up-conversion of the input frequency to a different output frequency. Up-conversion mixers are used in transmitters, and down-conversion mixers are used in receivers. There are two types of down-conversion mixers: direct and low-IF.

Referring to FIG. 1, a mixer 100 can be described as a three port device, comprising a radio frequency (RF) port 102, an intermediate frequency (IF) port 104, and a local oscillator (LO) port 106. For an up-conversion mixer, the RF port 102 is where the desired input signal is sensed, the LO port 106 senses the signal that is used to down-convert the input signal, and the down-converted signal results at the IF port 104. For an up-conversion mixer, the RF and IF ports 102, 104 would be reversed, and the LO port 106 would sense the signal used to up-convert the input signal.

Modulation is the process of varying a periodic waveform, i.e., a tone, in order to use that signal to convey a message. A mixer can act as an amplitude modulator or a demodulator. The process of modulation as performed by the mixer is the same as that of mixing, except that the amplitude modulation is often used to impose the amplitude of a lower frequency signal on top of a high frequency signal. The modulation process up-converts the input signal to a so-called "carrier frequency" and transmits it out. The demodulation process does the opposite. That is, the process of demodulation down-converts the carrier frequency signal and obtains the information/message from the resulting lower frequency signal.

In some instances, both the upper and lower sidebands of a modulated carrier signal will contain information. This double sideband modulation occurs when both the upper and lower sideband modulation appear at the output of the mixer. For down-conversion, the upper and lower sideband frequencies are given by:

$$f_{RF}+f_{LO} \text{ and } f_{RF}-f_{LO} \tag{1}$$

and for up-conversion, the upper and lower sideband frequencies are given by:

$$f_{IF}+f_{LO} \text{ and } f_{IF}-f_{LO} \tag{2}$$

Due to device non-linearities, the output spectrum of the two mixed signals is usually not only composed of the sum and difference frequencies, but includes various other frequencies as well. These other frequencies are generally much lower in power compared to the fundamental output frequencies given by equations (1) and (2). In general, the output of a down-conversion mixer will be composed of the following frequencies:

$$m \times f_{RF} \pm n \times f_{LO} \tag{3}$$

and the output of an up-conversion mixer will be composed of the following frequencies:

$$m \times f_{IF} \pm n \times f_{LO} \tag{4}$$

where m and n can be any positive or negative integer value.

The mixer discussed above can also be referred as a harmonic mixer, because it takes the fundamental harmonic frequency of the local oscillator and mixes it with the fundamental IF or the RF frequency of the input signal. Sometimes for direct-digital or zero-IF operations, in order to eliminate the unwanted effects of LO self-mixing which occurs in many fundamental frequency mixers, a so-called sub-harmonic mixer is used. In the sub-harmonic mixer, the output signal includes the sum and difference of the fundamental and one of the harmonics of the two input signals, for example, as given by:

$$f_1+2f_2 \text{ and } f_1-2f_2 \tag{5}$$

One important decision in the design of an RF front-end module for a transceiver is the type of up-conversion or down-conversion mixer that will be implemented. There are two primary types of mixers, namely active and passive mixers. Both types have benefits and drawbacks. At a high level, a passive mixer topology is usually selected when linearity and low noise are important design factors. Passive mixers are also often used in zero-IF receiver architectures due to the superior 1/f noise (also referred to as "flicker noise") and DC offset performance of the passive topology. 1/f noise is so-called due to its inverse relationship to frequency; that is, as the frequency increases, the 1/f noise decreases. An active mixer topology is generally selected when conversion gain is required in the front-end module, such as in receivers with a high second stage noise contribution.

SUMMARY

The choice of which type of mixer to implement is driven by system level analyses of the relevant performance trade-offs, such as power consumption, efficiency, gain, linearity, noise performance, etc. of the target application and the enabling technology. In general, given these factors for a single application, the choice of mixer is often straightforward. However, in multi-mode, multi-standard, multi-band applications, such as, for example, software defined radio (SDR) and other wireless communications systems, choosing a single mixer type can lead to significant compromises between performance metrics. Accordingly, aspects and embodiments are directed to a reconfigurable "hybrid" mixer that, while using the same circuitry, can change between various different mixer types and/or operating modes. As used herein, the term "hybrid" is intended to mean reconfigurable between two or more types. For example, the reconfigurable hybrid mixer may be configurable between active and passive, harmonic and sub-harmonic, up-conversion and down-conversion, upper and lower sideband modulation, as well as between different operating points, as discussed below. In addition, embodiments of the reconfigurable hybrid mixer include a gain control feature that can be used, for example, in applications that require automatic gain control, as discussed further below.

One aspect is directed to a frequency mixer or modulator circuit that is reconfigurable through electronic programming among active and passive operation, and/or harmonic and sub-harmonic operation, and/or up-conversion and down-conversion, and/or no-overlap, off-overlap, and on-overlap mixing, and/or upper-sideband and lower-sideband modulation and/or automatic gain control. In one example, the electronic programming is driven by software and a micro-controller or micro-processor. For example, the electronic programming may be driven by an adaptive algorithm whose adaptation is based on the conditions of the signal(s) to be processed. In another example, the electronic programming is driven by a hardware state machine. The frequency mixer or modulator circuit may have gain controlled by the local oscillator drive strength. The local oscillator drive strength requirement may be automatically determined by monitoring the conditions of the signal(s) to be processed.

In one embodiment, the frequency mixer or modulator circuit is reconfigured between active and passive modes by switches between the output load and the DC power supply. In another embodiment, the frequency mixer or modulator circuit may be reconfigured between harmonic and sub-harmonic modes by switching on and off half of the transistors in the mixing core, and by feeding LO signals at different phases. In another embodiment, the frequency mixer or modulator circuit is reconfigured between up-conversion and down-conversion mixer by switches between the source and circuit and the loads and the circuit. In another embodiment, the frequency mixer or modulator circuit is reconfigured between no-overlap, on-overlap, and off-overlap by adjusting the bias voltage at the gate of the mixer core. According to another embodiment, the frequency mixer or modulator circuit is reconfigured between upper or lower side-band modulator by switching the LO signal phases that are fed to the gates of the mixing core transistors.

In the active mode, the input stage of the frequency mixer or modulator circuit may have a configuration that is any of a common emitter configuration, common base configuration, common source configuration, common gate configuration, cascode, folded up or down cascode configuration, a common source stage with voltage feedback, and a transmission gate that can utilize its NMOS transistor as a common-gate while the PMOS switch is turned off. In the passive mode, the input stage of the a frequency mixer or modulator circuit can be a circuit comprising any of a transmission gate that can be used as a PMOS switch which is fully turned on, and a NMOS switch turned off, a common source with a bypass switch, a common gate with appropriate biasing, a cascode stage with a bypass switch, a folded up or down cascode stage with a bypass switch, a common source stage with voltage feedback, or a transmission gate that can utilize its NMOS transistor as a common-gate while the PMOS switch is turned off. The input stage, in either the passive or active mode, may also use a combination common-source, common-gate configuration. The input stage may further be matched to a desired input frequency and source impedance. In another example, the frequency mixer or modulator circuit uses a PMOS bleeder to support the transconductance stage and increase dynamic range of the mixer output voltage. In addition, in the active mode, the load stage of the frequency mixer or modulator circuit may comprise any of the following: a resistor, an inductor, a resonator, a resonator with a programmable varactor, a current source with appropriate biasing, and a diode connected transistor.

According to another embodiment, a reconfigurable hybrid frequency mixer comprises a programmable input stage configured to receive an input signal, a programmable mixing core coupled to the input stage and configured to receive the input signal and a local oscillator signal and to generate a mixed signal, a load stage coupled to the mixing core and configured to receive the mixed signal and provide an output signal, and a first switch coupled to the load stage and configured to be actuated by a control signal to couple the load stage to a supply voltage terminal in an active mode of the reconfigurable hybrid frequency mixer and to couple the load stage to a floating terminal in a passive mode of the reconfigurable hybrid frequency mixer.

In one example, the reconfigurable hybrid frequency mixer further comprises a programming bus coupled to the load stage, the mixing core and the input stage, and a controller configured to supply digital control signals to the load stage, the mixing core and the input stage via the programming bus. According to some examples, the input stage may comprise a transistor circuit having any of a common emitter configuration, a common base configuration, a common source configuration and a bypass switch, wherein the transistor circuit and the bypass switch are configured so that, in the passive mode, the bypass switch is actuated to bypass the transistor circuit, a common source configuration with voltage feedback, a common gate configuration, a cascode configuration and a bypass switch, wherein, in the passive mode, wherein the transistor circuit and the bypass switch are configured so that the bypass switch is actuated to bypass the transistor circuit, a folded-up cascode configuration, and a folded-down cascode configuration. According to some further examples, the load stage may comprise any of a resistor, a variable resistor, an inductor, a resonance circuit including an inductor coupled in parallel with a capacitor, a resonance circuit including the inductor, a resistor and a varactor all coupled in parallel with one another, a current source, and a diode-connected transistor.

In another example, the reconfigurable hybrid frequency mixer further comprises a local oscillator that generates a local oscillator signal, a frequency divider coupled to the local oscillator and configured to generate a divider signal that has a frequency of about half that of the local oscillator signal, and a second switch connected between the mixing core, the frequency divider and the local oscillator and configured to selectively couple one of the local oscillator signal and the divider signal to the mixing core, to reconfigure the reconfigurable hybrid frequency mixer between a harmonic mode and a sub-harmonic mode. In another example, the reconfigurable hybrid frequency mixer is further configurable between up-conversion and down-conversion. According to another example, the reconfigurable hybrid frequency mixer further comprises a local oscillator that generates a local oscillator signal, and a controller, wherein the mixing core comprises a plurality of transistors, and wherein the controller reconfigures the reconfigurable hybrid frequency mixer between a harmonic mode and a sub-harmonic mode by selectively turning off some of the plurality of transistors and by selectively controlling a phase of the local oscillator signal fed to the mixing core. The reconfigurable hybrid frequency mixer may be further configurable between mixing with no overlap, mixing with on-overlap and mixing with off-overlap by adjusting a bias voltage at a gate of at least some of the plurality of transistors of the mixer core. In one example, the controller reconfigures the reconfigurable hybrid frequency mixer between upper sideband modulation and lower sideband modulation by selectively controlling the phase of the local oscillator signal provided at the gate of the at least some of the plurality of transistors of the mixer core.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by reference signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

FIGS. 13A-G are circuit diagrams of examples of load stage configurations for the reconfigurable mixer according to aspects of the invention;

DETAILED DESCRIPTION

Figure 1:
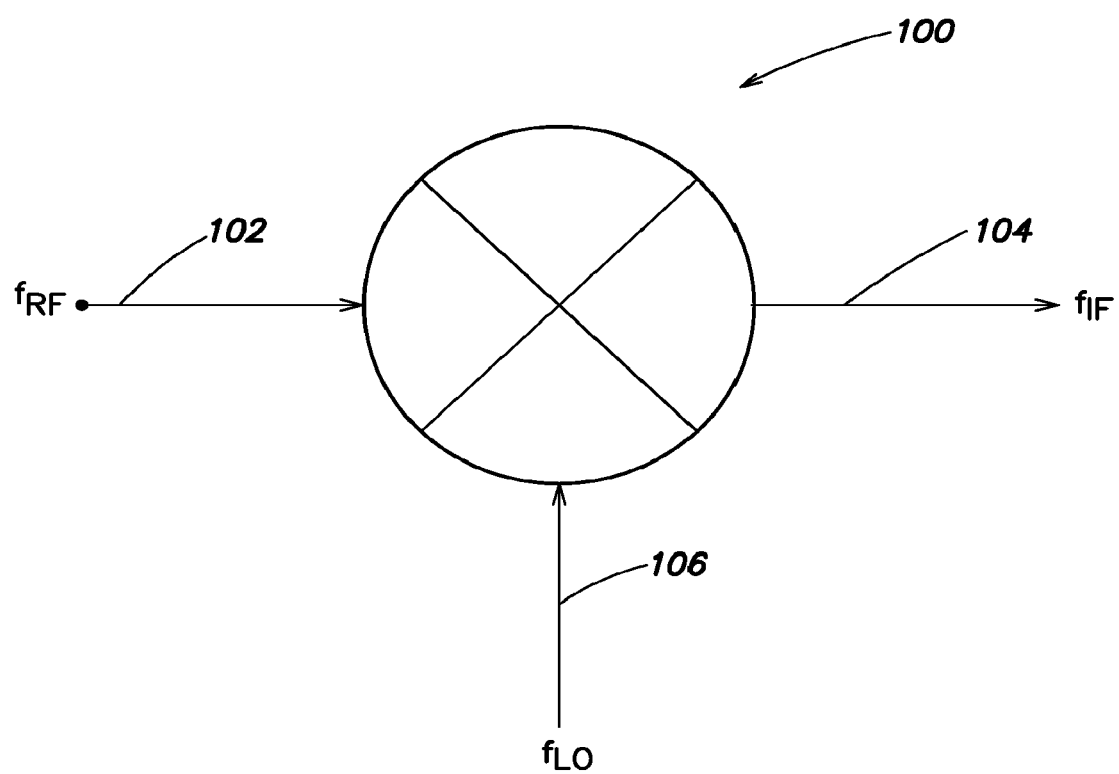
FIG. 1 is a schematic diagram of a mixer.

Aspects and embodiments of the present invention are directed to a programmable or reconfigurable hybrid mixer that can be configured for various modes of operation. The reconfigurable hybrid mixer is unique in its approach to solving the problem of providing multi-standard and multi-mode compatibility with minimal additional circuitry to switch between active and passive modes of operation, as well as between other modes of operation, such as upper and lower sideband modulation, harmonic and sub-harmonic operation, and up-conversion and down-conversion. Embodiments of the reconfigurable mixer are also programmable among three different operating points, as discussed below. The ability to switch between the various modes of operation presents a mixer with highest versatility. In addition, embodiments of the reconfigurable mixer include adjustable gain based on the local oscillator drive strength, thereby providing a programmable gain control feature, as discussed further below.

A programmable hybrid mixer may be particularly useful in applications where divergent system parameters (for example, when compared across different modes or frequency bands) cause difficulty in selecting a single mixer type. An example of such a system is a dual-mode GSM-WiMax application. In the GSM mode, high sensitivity requirements favor one mixer type, whereas the wide bandwidth and high linearity requirements of the WiMax mode favor a different mixer type. It should also be noted that a hybrid mixer design which is more costly in any relevant metric is far less attractive. Examples of relevant metrics include power consumption, die area, support circuitry, complexity, etc. In embodiments of the reconfigurable hybrid mixer according to aspects of the invention, the power consumption is not increased significantly, the die area may be slightly increased due to a few extra circuit components, support circuitry is minimal, and the design is not complex. Accordingly, embodiments of the reconfigurable hybrid mixer may be very desirable for many different applications.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation. It is further to be appreciated that while the illustrations of various components and aspects of the reconfigurable mixer are in NMOS/PMOS technology, one skilled in the art could easily recognize the applications to PMOS only, NMOS only, CMOS, BJT, BiCMOS, GaAs and other enabling technologies with only minor adjustments.

Figure 2:
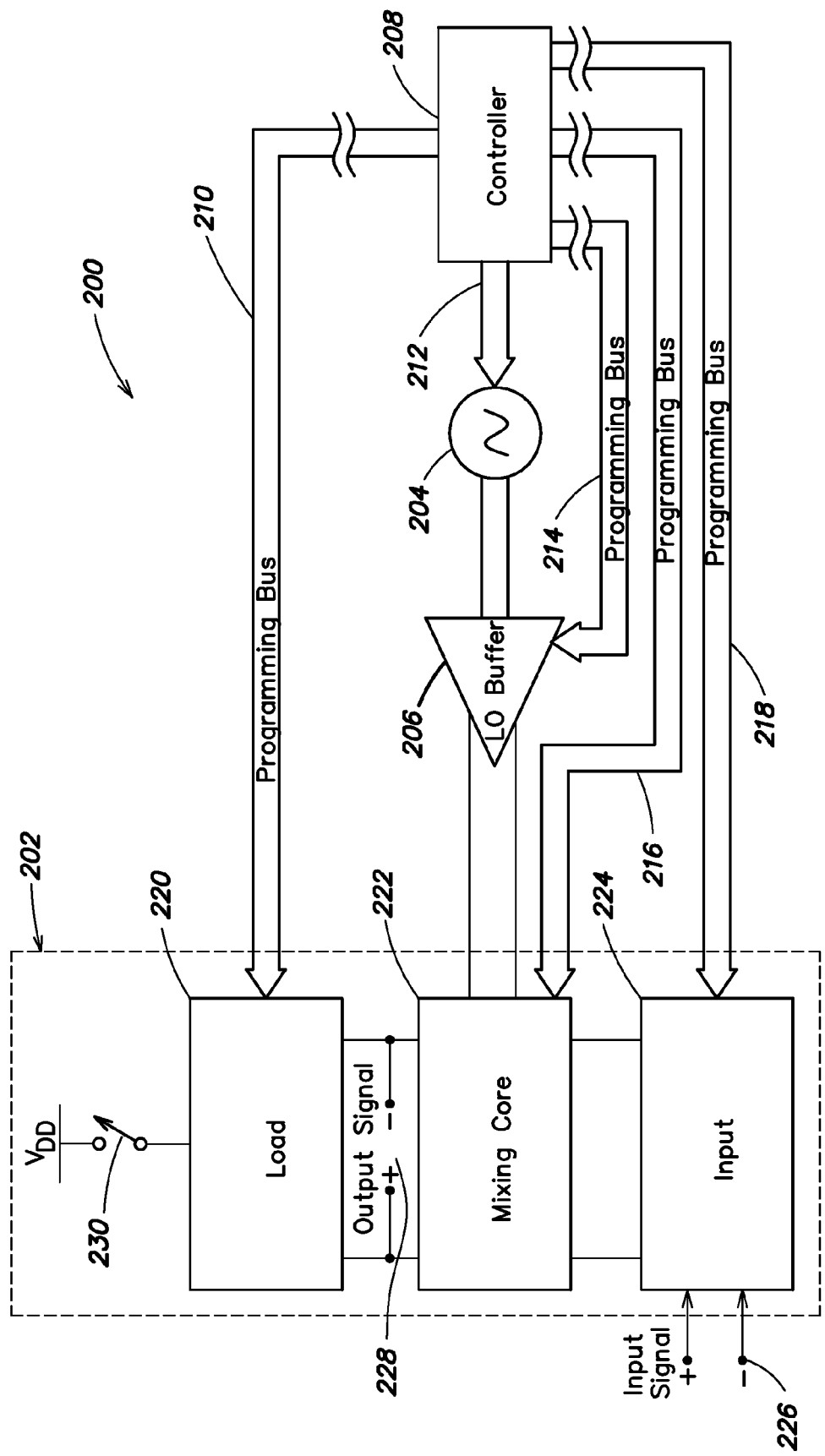
FIG. 2 is a block diagram of one example of a reconfigurable hybrid mixer according to aspects of the invention.

Referring to FIG. 2, there is illustrated a block diagram of one example of a reconfigurable hybrid mixer 200. The reconfigurable hybrid mixer 200 comprises a reconfigurable mixer 202, a programmable polyphase voltage controlled oscillator (VCO) 204, a reconfigurable local oscillator (LO) buffer 206 with LO bias control, a controller 208 that programs the reconfigurable mixer 202, and programming busses 210, 212, 214, 216 and 218. The programming busses 210, 212, 214, 216 and 218 carry control signals from the controller to various components of the reconfigurable hybrid mixer to change the mode of the operation in the reconfigurable hybrid mixer, as discussed below. The reconfigurable mixer 202 comprises three component blocks, namely, a load stage 220, a mixing core 222, and an input stage 224. Embodiments of each of these component blocks are discussed in detail below. The reconfigurable mixer 202 receives an input signal at input terminal 226 and provides an output signal at output terminal 228. It is to be appreciated that the input and output may be differential, as illustrated in FIG. 1, or single-ended. A switch 230 is used to control whether the mixer will consume power or not, in other words to choose between the active and passive mode of operation. The configuration settings and the controllability of the various components of the reconfigurable hybrid mixer 200 is discussed in detail below.

Figure 3A:
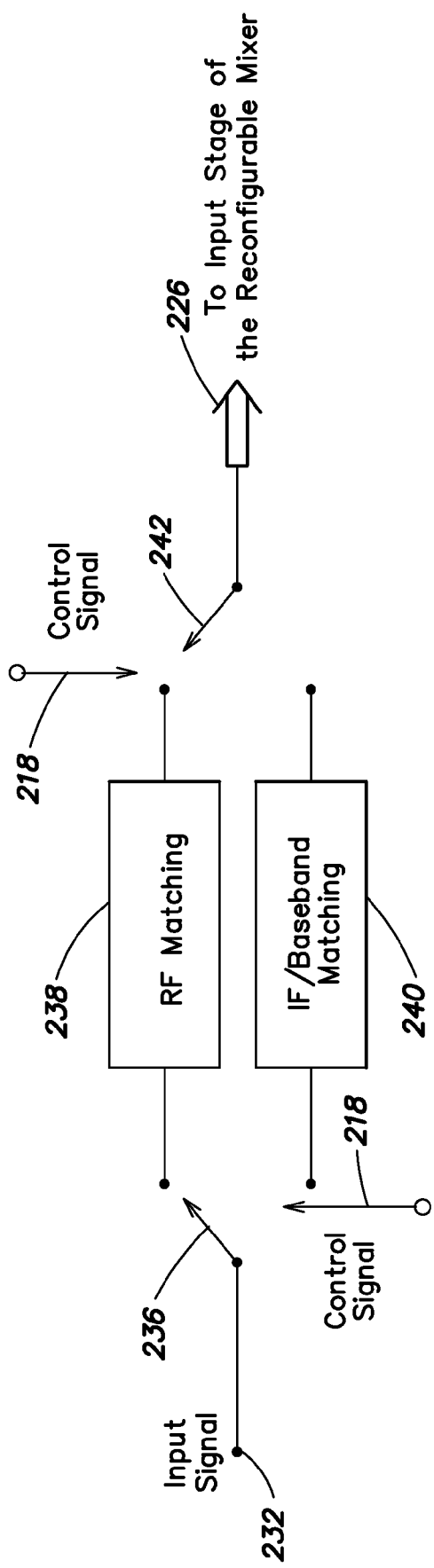
FIG. 3A is a block diagram illustrating an example of input matching for the reconfigurable hybrid mixer according to aspects of the invention.
Figure 3B:
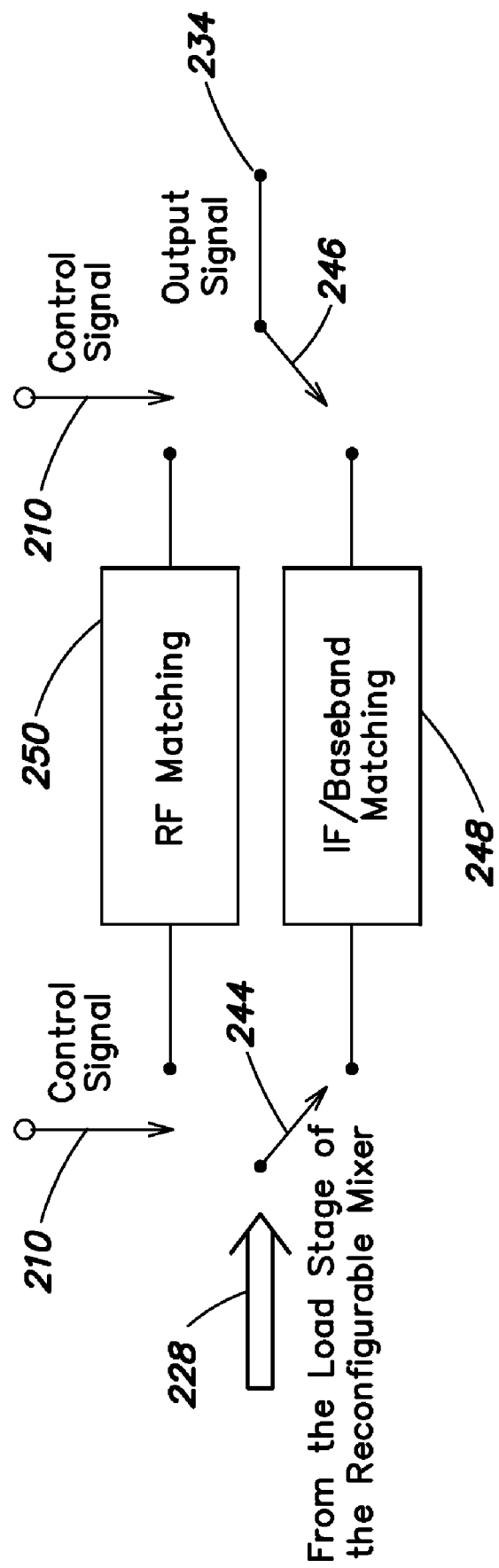
FIG. 3B is a block diagram illustrating an example of output matching for the reconfigurable hybrid mixer according to aspects of the invention.

Referring to FIGS. 3A and 3B, there is illustrated one embodiment of external circuitry for coupling the input signal at terminal 232 to the input stage 224 (FIG. 3A), and coupling the load stage 220 to an output terminal 234 (FIG. 3B), to complete the overall reconfigurable mixer topology. In one example, input and output matching circuitry is used to configure the mixer so that it can operate as either an up-converter or a down-converter. As shown in FIG. 3A, according to one embodiment, an input switch 236 is used to route the input signal at terminal 232 to one of an RF matching circuit 238 and an IF matching circuit 240, depending on whether the input signal is an RF signal or an IF signal. In one example, a difference between these two matching circuits 238, 240 is that in the RF matching circuit 238 an AC coupling capacitor is used, whereas in the IF matching circuit 240, an AC coupling capacitor is not required. It will be appreciated by those skilled in the art that numerous other differences may exist between the RF matching circuit 238 and the IF matching circuit 240, and that these circuits may be implemented in a variety of ways. An output switch 242 may be used to appropriately couple the input stage 224 of the mixer 202 to either the RF matching circuit 238 or the IF matching circuit 240 to receive the input signal. In one example, the input switch 236 and output switch 242 are actuated together, for example, by using a common control signal, such that there is always a completed path from the terminal 232 to the input terminal 226 through one of the RF matching circuit 238 and the IF matching circuit 240. In one example, the switches 236, 242 are actuated by a control signal supplied from the controller 208 (see FIG. 2) via the programming bus 218. The control signal may include a bit value used to change the state of the switches 236, 242.

Once the input signal is mixed, it is either up-converted or down-converted based on the input signal frequency. If the input signal is an RF signal, then the reconfigurable mixer 202 may operate as a down-converter generating an IF output signal at output terminal 228. In this case, referring to FIG. 3B, switches 244 and 246 may be actuated to couple an IF output matching circuit 248 to the output terminal 228. Alternatively, if the input signal at input terminal 226 is an IF signal, then the mixer 202 may operate as an up-converter generating an RF signal at output terminal 228, and the switches 244, 246 may be actuated to connect RF output matching circuitry 250. The switches 244, 246 are actuated by a control signal supplied from the controller 208 (see FIG. 2) via the programming bus 210. As discussed above, in one example the control signal includes a bit value that changes the state of the switches 244, 246.

As discussed further below, using digital control signals supplied via the programming buses 210, 216 and 218 from the controller 208 to the load 220, mixing core 222 and input 224 stages, respectively, of the reconfigurable mixer 202, the reconfigurable mixer 202 can be adjusted so that it operates as an up-converter or down-converter (modulator or de-modulator), harmonic or sub-harmonic mixer, active or passive mixer. Similarly, digital control signals can be supplied from the controller 208 to the polyphase VCO 204 (via programming bus 212) and LO buffer 206 (via programming bus 214) to further configure and control mixer operation. Depending, for example, on the amount of information needed in each control signal to properly control operation of the respective component, each of the digital signals provided on the programming buses 210-218 may have the same or different numbers of bits and may be implemented as separate control words, or groups of bits of the same, common control word. In one example, a digital control word is supplied by the controller 208 and its bits can be divided into different sections/groups to control various operating modes and conditions of the reconfigurable mixer 202. The ability to reconfigure the mixer 202 among a variety of different operating modes and conditions through the use of digital control signals make embodiments of the reconfigurable hybrid mixer suitable for numerous applications, while also offering significant savings in die area when the mixer is implemented as an integrated circuit (chip).

Figure 4:
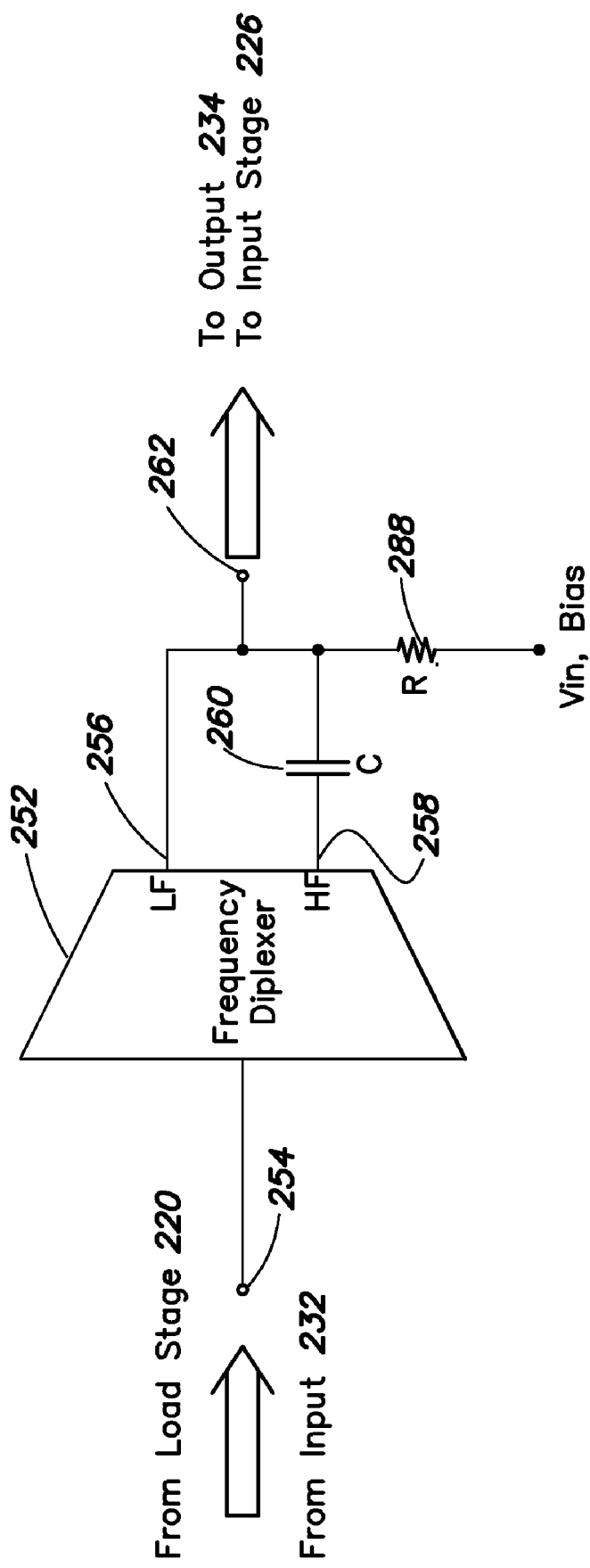
FIG. 4 is a block diagram of another example of input/output matching circuitry that for configuring the mixer between up-conversion and down-conversion using a frequency diplexer according to aspects of the invention.

Referring to FIG. 4, there is illustrated another example of circuitry that can be coupled to the input and output terminals 226, 228 of the reconfigurable mixer 202 to allow the reconfigurable mixer to operate as either an up-converter or a down-converter. Using a frequency diplexer 252, a signal at terminal 254 (from either the input 232 (see FIG. 3A) or the load stage output terminal 228) can be divided into two ports 256, 258. In one example, the first port 256 will output all the low frequency content (i.e., IF or baseband frequencies) and the second port 258 will output the high frequency content (i.e., RF frequencies) of the signal. By splitting the signal at terminal 254 into two paths, appropriate matching and/or filtering can be applied to each path individually. For example, the high frequency signal at port 258 may be fed to an AC coupling capacitor 260 before it is output at terminal 262, which is coupled to either the output 234 (see FIG. 3B) or the input stage 224 input terminal 226, whereas the low frequency signal at port 256 may be fed directly to terminal 262. An adjustable bias voltage may be applied to terminal 262 via resistor 288 to adjust the input or output common mode voltage to a desired value, such that it can change the operating point of the input and output stage (226/234) at high frequencies. For low frequencies, a separate biasing circuit can be used to change the bias point of the signal. These circuits are also referred to as common-mode circuits. The "low" frequency refers to any frequency that is below a threshold frequency $f_{LOW}$. The value of the $f_{LOW}$ frequency threshold will depend on the input impedance of the input stage 226, or the impedance looking from the output 234 to the circuitry (next stage) that the mixer 200 will be driving. In one example, the size of the AC coupling capacitor 260 can be an important factor. The lower the frequency $f_{LOW}$, the larger the capacitor 260, and the lower the input impedance of the input stage 224 or the lower the input impedance of the next stage the larger the required capacitor. In integrated circuit design, size/area may be an important factor driving the limits of the size of capacitor that can be used on-chip. When operating the mixer in passive or active mode the common mode voltage will be different in both modes. Thus, providing an adjustable bias point will allow a system level designer or user to reconfigure the mixer for the best overall system performance based on mixer's configuration.

Figure 5:
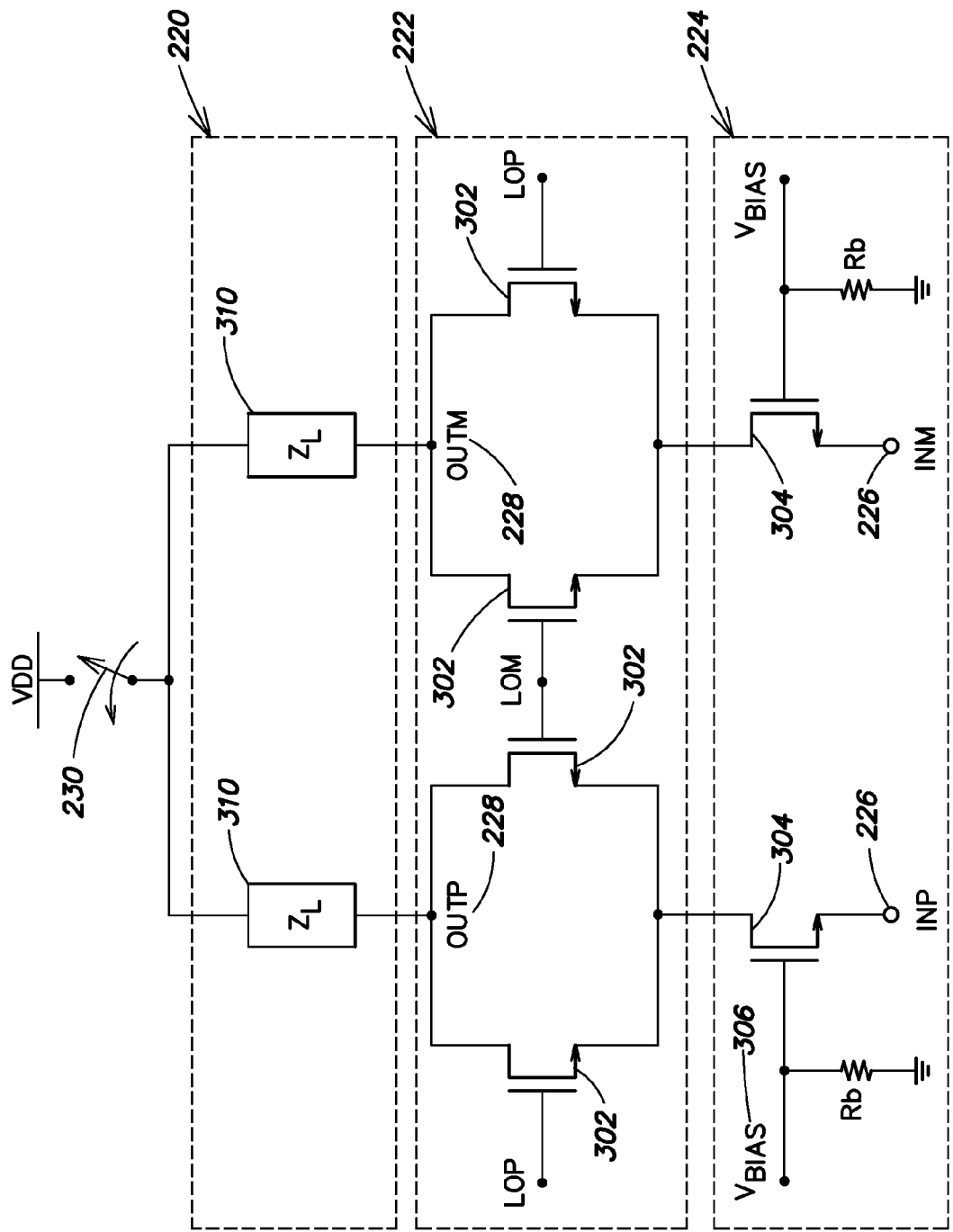
FIG. 5 is a circuit diagram of one example of a reconfigurable mixer with a common-gate input stage according to aspects of the invention.

As discussed above, according to one embodiment, a reconfigurable hybrid mixer is configurable between an active topology and a passive topology. Referring to FIG. 5, there is illustrated a circuit diagram of one example of the reconfigurable mixer 202, including the load 220, mixing core 222 and input stage 224. In FIG. 5, LOP and LOM refer to the local oscillator positive (plus P) and negative (minus M) signals that are used to mix the input signal and upconvert/downconvert it. The LOP and LOM are 180 degrees apart from each other and constitute a signal supplied from the LO buffer 206. According to one embodiment, the switch 230 can be used to configure the reconfigurable mixer 202 so that it can operate as an active mixer or as a passive mixer based on the source voltage (VDD) connectivity. By allowing the current to flow through the switch 230, the mixer topology is converted into an active topology in which the signal is commutated in the current domain and the mixer 202 consumes power. By shutting the switch 230 off, the mixer topology shuts down the current flow and makes the mixing occur in the voltage domain using the switches 302 in the mixing core 222 and by causing the $V_{DS}$ of these switches 302 to be equal to zero. In passive mode, the transistors 304 will be operating as switches and they will be fully turned on, causing, a $V_{DS}$ of zero volts across them. In this case, there will be no current flowing through the transistors 304. The gate of each of the transistors 302 will be biased in such a way that the $V_{DS}$ of these transistors 302 will also be equal to zero, causing no current to flow through the overall mixer, because switch 230 is switched off when the mixer is in the passive mode. The local oscillator signal being applied at the gate of transistors 302 will cause the transistors 302 to either be fully ON or fully OFF, thus mixing in voltage domain. In active mode, the transistors 304 are biased in such a way that there is some gain in the input stage 224 before the signals are passed to the mixing core 222. The biasing of transistors 304 through the bias voltage 306 causes some current to flow through the overall mixer, and the switch 230 is turned on. The gate voltage at the transistors 302 will be biased in such a way that the LOP and LOM signals will perform the mixing operation in current domain, causing the voltage across $Z_L$ 310 to be modulated and formed by the mixed current effect.

Still referring to FIG. 5, one example of an input stage 224 that can be used for the reconfigurable mixer 202 is a common-gate input stage. The common-gate is presently favorable for some examples because the input signal at input terminal 226 can go through the source of the transistors 304, and the gate voltage can be used to adjust whether the $V_{DS}$ of the transistors 304 is equal to zero or not. By making the $V_{DS}$ equal to zero, the transistor 304 operates as a switch, thus turning the overall mixer topology into a passive mixer. The transistors 304 thus operate in conjunction with switch 230. As discussed above, for passive mode operation of the mixer, the transistors 304 are fully on and switch 230 is off, and the four transistors 302 are biased in such a way that when the local oscillator changes the gate voltage of the transistors 302 they either turn fully on or fully off, causing the mixing process in voltage domain. For active mode operation of the mixer, the switch 230 is on, transistors 304 are biased in such a way that there is gain in the signal from the input stage 224. In one example, the operating point (gate voltage at the transistors 302) is chosen in such a way that the $V_{DS}$ across each transistor 302 is approximately one third of the $V_{DD}$. According to one embodiment, the operating point is controlled by the LO buffer 206 and may be implemented similarly to the $V_{LOBIAS}$ circuitry 316 illustrated in FIG. 15 and discussed below.

According to one embodiment, by picking the correct width size on the transistor 304, the noise on the switch can be minimal and will not degrade the overall performance of the passive mixer. The equation for noise of a switch transistor is:

$$v_n^2 = \frac{8kT}{g_{ds}} \qquad (6)$$

where the transconductance, $g_m$ is directly proportional to width (W) according to the relationship:

$$g_{ds} = \mu_n C_{ox} \frac{W}{L}(V_{gs} - V_{th})(1 + \lambda V_{ds}) \qquad (7)$$

Thus, the larger the width, the larger the transconductance, leading to smaller noise generated by the switch. The conversion gain of the passive mixer will ideally be given by:

$$A_{V,passive}(\text{dB}) = 20\log_{10}\left(\frac{2}{\pi}\right) \qquad (8)$$

In the active configuration, the current flows through all the transistors 302, 304, as well as through the switch 230 and load 310. The bias voltage 306 may be chosen carefully to make the common-gate stage have a particular transconductance. As known to those skilled in the art, the transconductance is the ability of a transistor to transfer current; the higher the transconductance, the more current can flow through the transistor. The transconductance of a transistor depends on numerous factors, such as channel width, length, oxide capacitance, mobility, etc. The equation for transconductance, $g_m$, is given in equation (7) above. Depending on the process used to form the transistor (e.g., CMOS, etc.), the transistor will have a specified mobility ($\mu_n$) threshold voltage ($V_{th}$), width (W), length (L), lambda ($\lambda$) and oxide capacitance ($C_{ox}$). Accordingly, to achieve a specified gain of the mixer, equation (9) below can be used to calculate the transconductance, $g_m$, and from there equation (7) can be used to select the appropriate bias voltage, $V_{gs}$. The load impedance 310 of the overall topology will also affect the voltage conversion gain of the active mixer, which is given by:

$$A_{V,active}(\text{dB}) = 20\log_{10}\left(\frac{2}{\pi}g_m z_L\right) \qquad (9)$$

In one example, the bias voltage 306 of the common-gate stage can be programmed through bits of a digital control signal supplied on programming bus 218 from the controller 208. These "control bits" may control the bias voltage via a voltage R-2R. R-2R DAC circuits are used to generate binary weighed voltage sources. These circuits use an R-2R configuration to divide the $V_{DD}$ voltage down to $2^X$ number of levels. Based on the binary setting, one can set the output voltage of the R-2R circuit. For example, using an R-2R DAC that divides a 1.5 volt $V_{DD}$ into 512 levels (9-bits), the setting 455 will give an output voltage of 1.333 volts. The R-2R DAC can also be referred to as a digital to analog converter; however, R-2R circuits are typically more suitable for setting DC voltages such as, for example, bias points.

Figure 6:
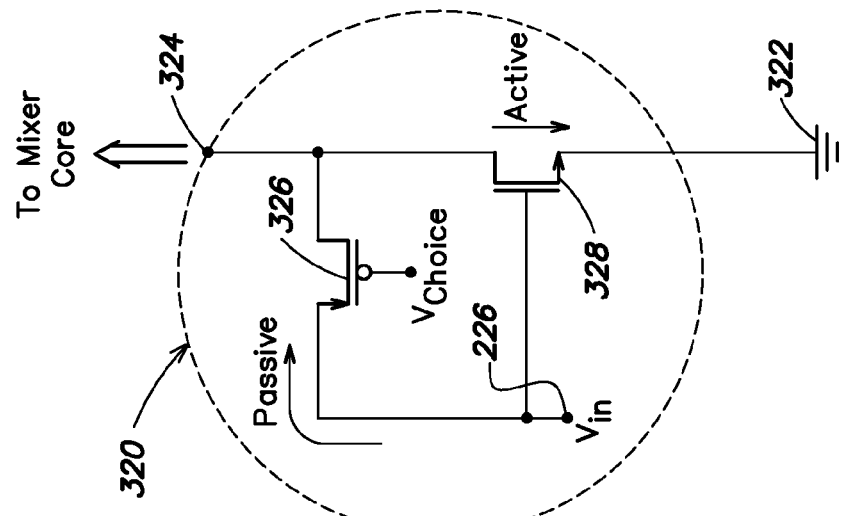
FIG. 6 is a circuit diagram of an example of a common-source configuration for the input stage of the reconfigurable mixer according to aspects of the invention.

It will be appreciated that the input stage 224 can be implemented in a variety of ways using many different configurations. Another example of an input stage 224 to the reconfigurable mixer 202, namely a common-source configuration, is illustrated in FIG. 6. In some examples, this common-source input stage 320 configuration is very suitable for the active mixer topology. However, when the reconfigurable hybrid mixer is operated as a passive mixer, the input voltage at terminal 226 is routed to the mixing core 222, via terminal 324 to be mixed in the voltage domain. Accordingly, in order to make the common-source input stage configuration 320 suitable for both the active and passive mixer topologies, a PMOS switch 326 may be added between the gate and drain 324 of the common source transistor 328. The gate voltage, $V_{CHOICE}$, applied to the switch 326 determines whether the mixer is operating as an active mixer or a passive mixer. For example, when $V_{CHOICE}$ is high, the PMOS switch 326 is ON causing the signal to flow directly through the switch 326, and not at the gate of transistor 328. In this case, the input signal 226 is directly applied to the mixing core 222. In the active mode, the PMOS switch 326 is turned OFF by making the $V_{CHOICE}$ signal low. In this case, the input signal 226 will flow directly to the gate of transistor 328 to be amplified and then transmitted to the mixing core 222. The common-source transistor 328 may be biased at the source with a ground connection 322, as illustrated in FIG. 6, or to a current source (not shown), or a bias voltage (not shown).

Figure 7:
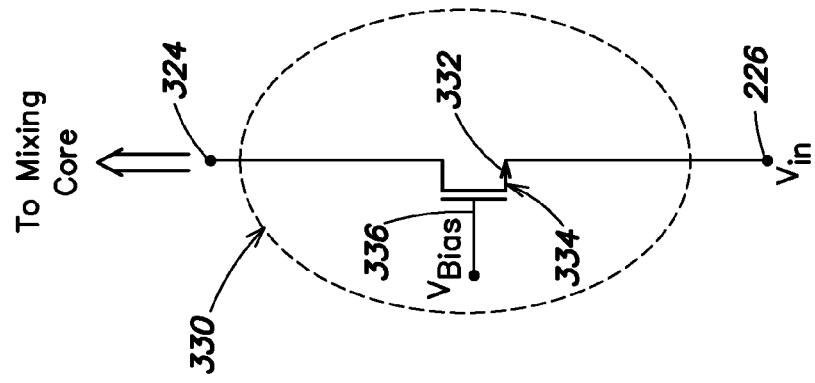
FIG. 7 is a circuit diagram of one example of a common-gate configuration for the input stage of the reconfigurable mixer according to aspects of the invention.

Another example of an input stage 224 is the common-gate configuration 330 illustrated in FIG. 7. This configuration is currently preferred for some embodiments of the reconfigurable hybrid mixer 200. The input signal at terminal 226 may be fed to the source 332 of the transistor 334, and the bias voltage 336 will configure the reconfigurable mixer 202 to operate as either a passive or active mixer. Specifically, when there is no current flowing through the mixer 202, the bias voltage 336 can be set to $V_{DD}$, thus making the transistor 334 operate as a pure switch and mix the signal in the voltage domain. The output signal is supplied from the input stage 224 to the mixing core 222 via terminal 324. In the active configuration, when there is current flowing through the common-gate input stage 330, the bias voltage 336 can be selected to control parameters of the input stage 330. The value of the bias voltage 336 changes the transconductance, gm, value of the transistor 334, and thus changes the conversion gain of the mixer 202. In addition, an optimum choice of the value of the bias voltage 336 is desired so that the mixer consumes a minimal amount of current. As discussed above, the bias voltage may be selected using equations (7) and (9) to select the smallest transconductance, $g_m$, that results in the desired gain. The common-gate configuration 330 for the input stage 224 offers the advantage of inter-operability between the active and passive mixer topologies. However, a disadvantage of the common-gate configuration 330 is that the input impedance of the input stage 224 in this configuration is very small compared to the large impedance of the common-source configuration 320 (see FIG. 6) in which the input signal is fed to the gate of the transistor 328. The input impedance of the common-gate configuration 330 may be adjusted by the placement of a few passive components at the input of the transistor 334 so that the input impedance seen from those components is as high as desired.

Figure 8:
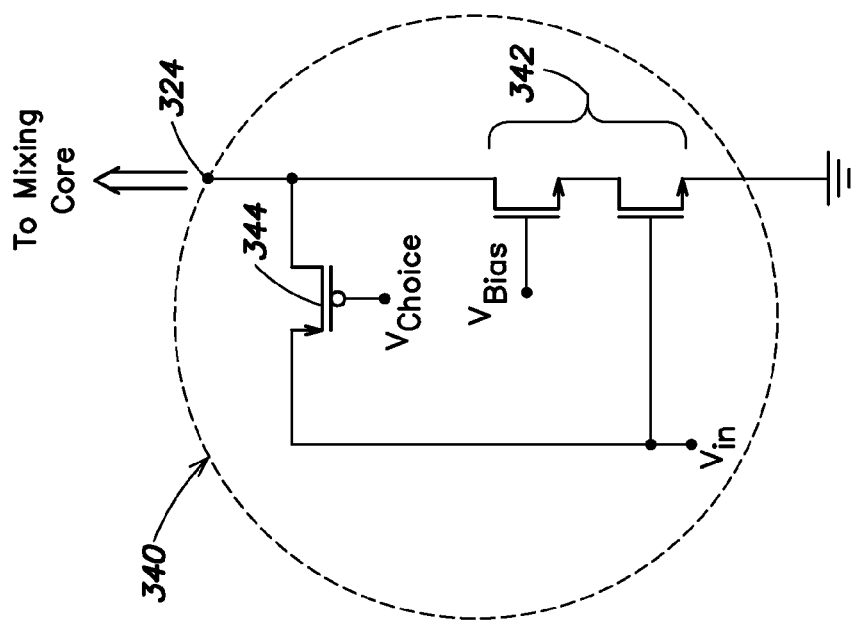
FIG. 8 is a circuit diagram of one example of a cascode common-source configuration for the input stage of the reconfigurable mixer according to aspects of the invention.

Referring to FIG. 8, there is illustrated another example of an input stage 224 that may be used in the reconfigurable mixer 202. In the example illustrated in FIG. 8, the input stage configuration 340 uses a cascode common-source input stage 342 with a PMOS switch 344 to control whether the mixer operates in the passive or active mode. Again, the value of the bias voltage, $V_{CHOICE}$, applied to the switch 344 controls whether the mixer operates as an active or passive mixer, as discussed above. The cascode input stage 340 may have higher voltage conversion gain in the active operating mode, while limiting the input voltage swing due to the extra $V_{DS}$ on the cascode transistors. The conversion gain for this input stage configuration may be give by:

$$A_{V,active}(dB) = -20\log_{10}\left(\frac{2}{\pi}g_{m1}g_{m2}z_L\right) \quad (10)$$

where $g_{m1}$ and $g_{m2}$ are the transconductances of the two transistors in the cascode stage 342.

Figure 9B:
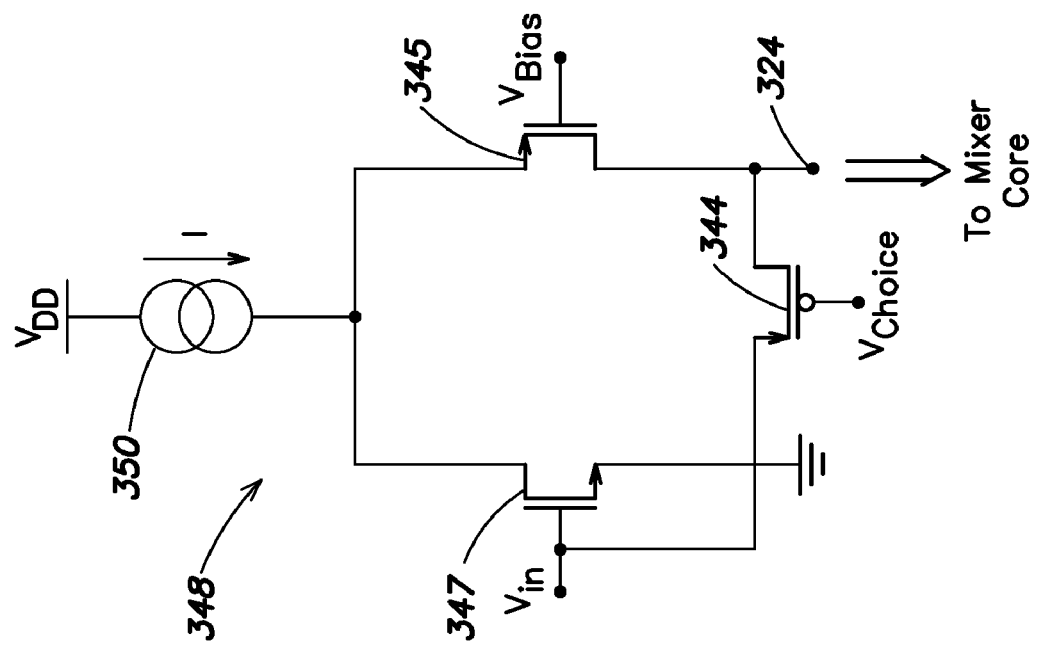
FIG. 9B is a circuit diagram of an example of a folded-down configuration for the input stage of the reconfigurable mixer according to aspects of the invention.
Figure 9A:
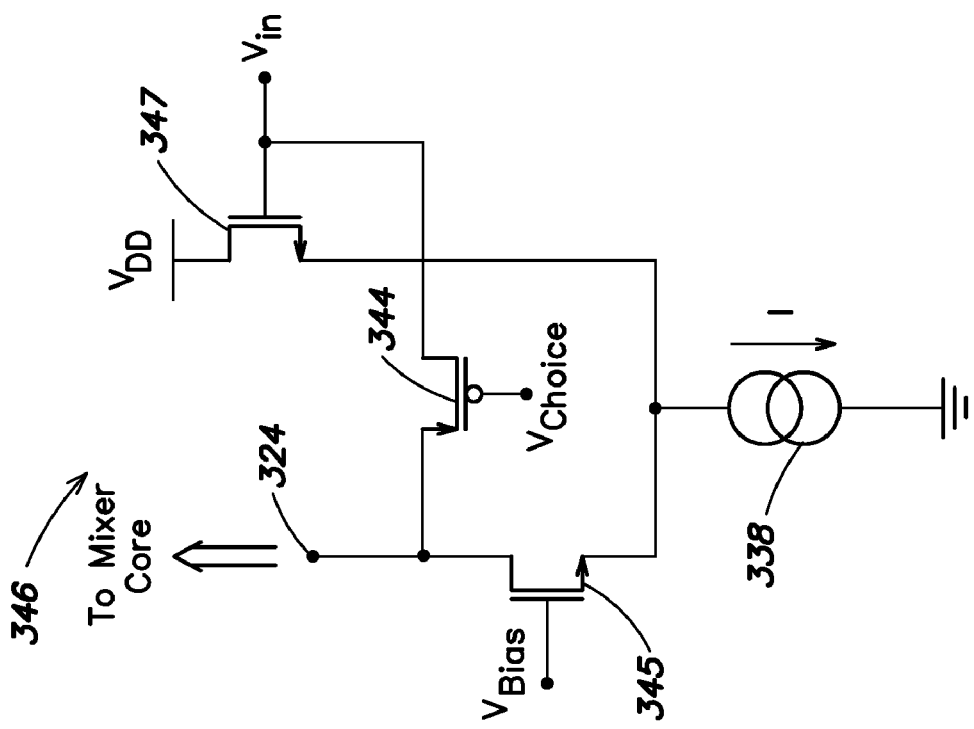
FIG. 9A is a circuit diagram of an example of a folded-up configuration for the input stage of the reconfigurable mixer according to aspects of the invention.

Two further examples of input stage 224 configurations that may be used with the reconfigurable mixer 202 are the folded up configuration 346 and folded down configuration 348 illustrated in FIGS. 9A and 9B, respectively. The PMOS switch 344 is included in both of these input stage configurations 346, 348 to control whether the reconfigurable mixer 202 operates as an active or passive mixer, as discussed above. The current sources 338 and 350 are used to properly bias the transistors 345 and 347. The conversion gain of the reconfigurable mixer 202 using either these two input stage configurations 346, 348 is substantially the same as with the cascode input stage configuration 340, except that the input swing is not a limitation due to folding. As disadvantage of the folded up and folded down configurations 346, 348 is that they consume more power relative to the other examples of input stages 224 discussed above.

Figure 10:
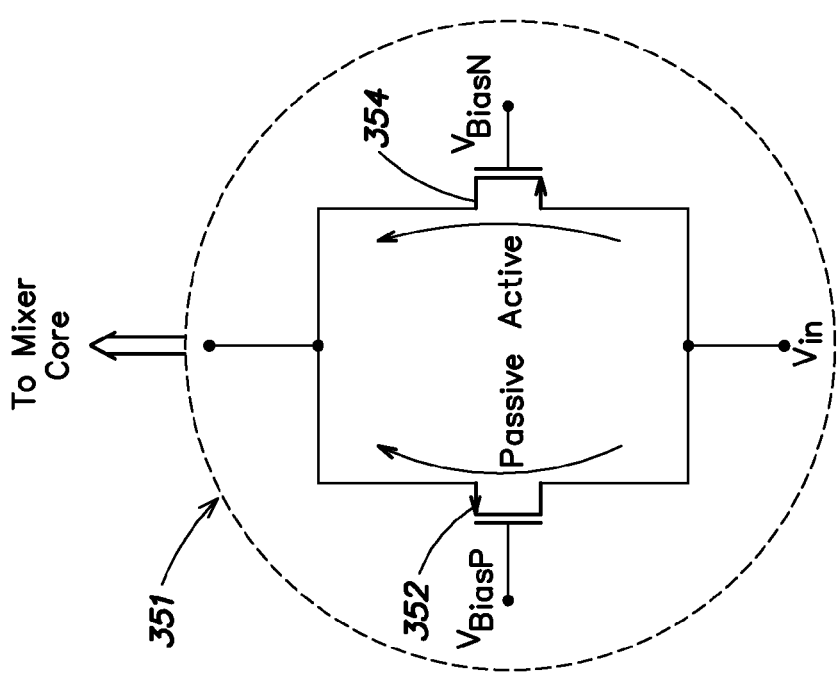
FIG. 10 is a circuit diagram of an example of a transmission gate configuration for the input stage of the reconfigurable mixer according to aspects of the invention.

Referring to FIG. 10, there is illustrated another example of an input stage 224 using a transmission gate configuration 351, which is presently preferred in some embodiments of the reconfigurable hybrid mixer. When the reconfigurable hybrid mixer 200 is operating in the passive mode, the PMOS transistor 352 can be fully turned ON and the NMOS transistor 354 can be completely OFF. Therefore, in the passive mode, the input signal flows through the PMOS transistor 352 and is mixed at the mixing core 222 in the voltage domain. Alternatively, the reconfigurable hybrid mixer 200 using the transmission gate configuration 351 for the input stage 224 can be configured to operate as an active mixer by shutting OFF the PMOS transistor 352 and biasing the NMOS transistor 354 appropriately.

Figure 11:
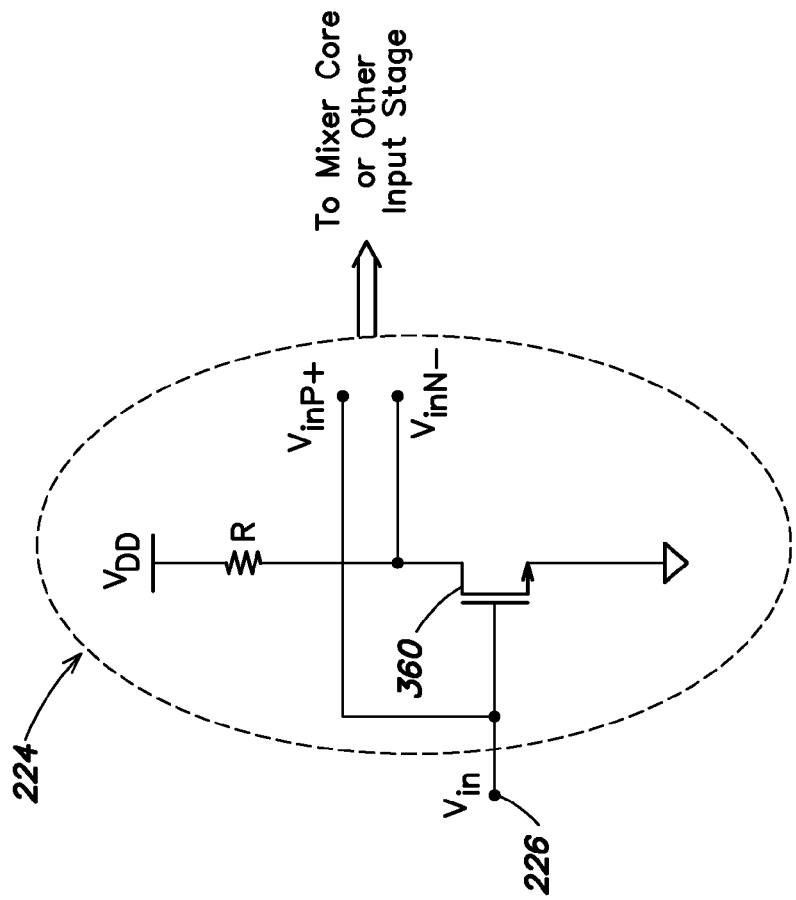
FIG. 11 is a circuit diagram of another example of an input stage for the reconfigurable mixer according to aspects of the invention.

According to another embodiment, the input stage 224 of the reconfigurable hybrid mixer 200 may receive a single-ended input signal at terminal 226 and convert the signal into a differential signal by using both the common-source and the common-gate input stage configurations together in one input stage 224, as illustrated in FIG. 11. It is to be appreciated that the input stage 224 may be implemented in various ways and the invention is not limited to the use of this type of single-ended to differential conversion. As shown in FIG. 11, the input signal at terminal 226 is applied to the gate of the transistor 360 and then converted to a differential signal. As discussed above, when the reconfigurable mixer 202 is operating as a passive mixer, the mixer only commutates the signal in the voltage domain. Thus, this configuration is more suited for a passive mixer; however it can be adapted for an active mixer by including additional circuitry, as would be recognized by those skilled in the art given the benefit of this disclosure.

Figure 12:
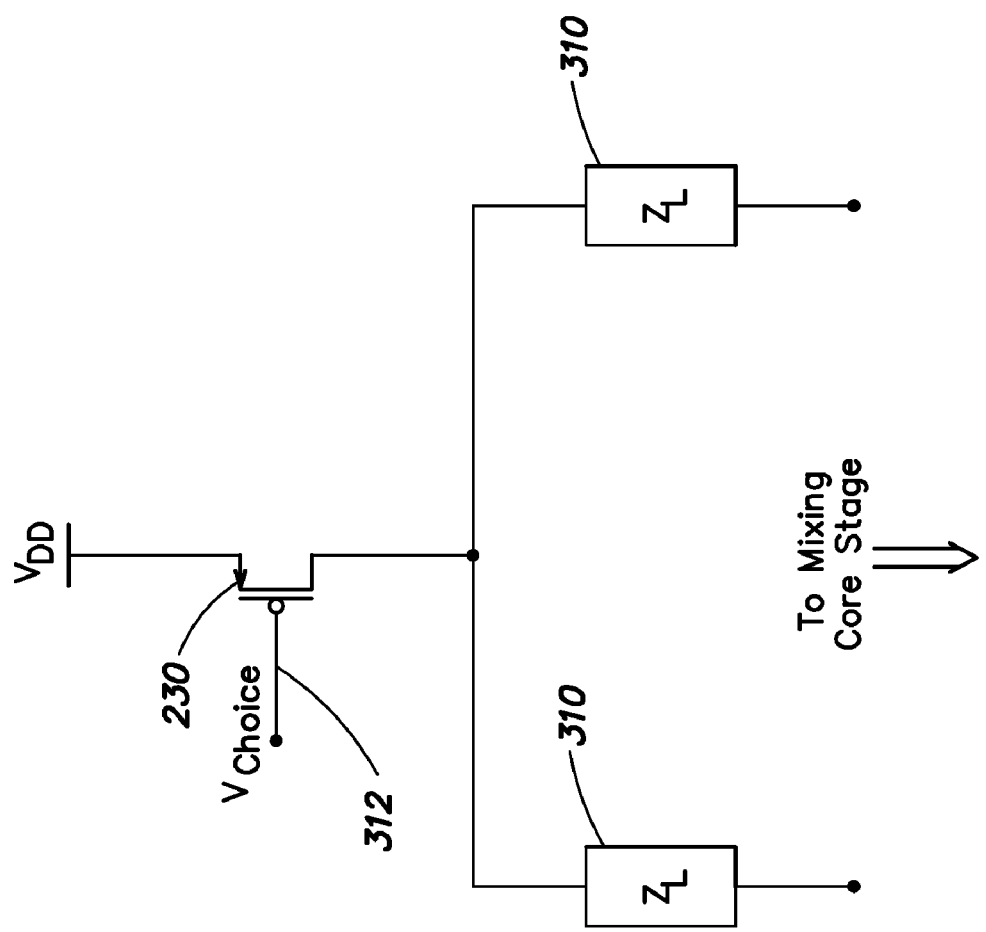
FIG. 12 is a block diagram of one example of a load stage of the reconfigurable mixer, showing a switching option between the passive and active operating modes of the reconfigurable mixer, according to aspects of the invention.

Referring to FIG. 12, there is illustrated one example of the load stage 220 of the reconfigurable mixer 202. In the illustrated example, the load stage 220 can be switched ON and OFF based on a PMOS switch 230. It is to be appreciated that the switch 230 may be implemented in various ways and the invention is not limited to the use of a PMOS switch. Based on the gate voltage 312 of the switch 230, the reconfigurable mixer can operate as an active or a passive mixer. Setting the gate voltage 312 ($V_{CHOICE}$) to $V_{DD}$ will cause the hybrid mixer to operate as a passive mixer, by turning the switch 230 OFF. Alternatively, setting $V_{CHOICE}$ equal to approximately zero volts will turn the switch 230 ON, causing the reconfigurable mixer 202 to operate as an active mixer. By picking the right width size of the transistor the switch will not adversely affect the load stage 220 when operating as an active mixer, or the input and/or output stage when operating as a passive mixer. The "right" width size is dependent on the application and the input and output impedance requirements for the active mixer. The resistance value of the switch (implemented using a transistor) 230 when it is ON is given by:

$$R_{ON} = \frac{1}{\mu_p C_{ox}\left(\frac{W}{L}\right)(V_{DD} - V_{CHOICE} - |V_{THP}|)} \quad (11)$$

In one example, the width (W) is large so that the ON-resistance in the active mode is very small.

As will be recognized by those skilled in the art, the load impedance 310 of the load stage 220 can be designed and implemented in many ways and may have both real and/or imaginary parts, and is therefore shown is FIG. 6 as simply a representative box $Z_L$. Similar to control of the bias voltage 306 discussed above, the voltage $V_{CHOICE}$ can be programmed using, for example, an R-2R DAC or other voltage control mechanism, based on and responsive to an n-bit digital control signal supplied from the controller 208 via programming bus 210.

Figure 13B:
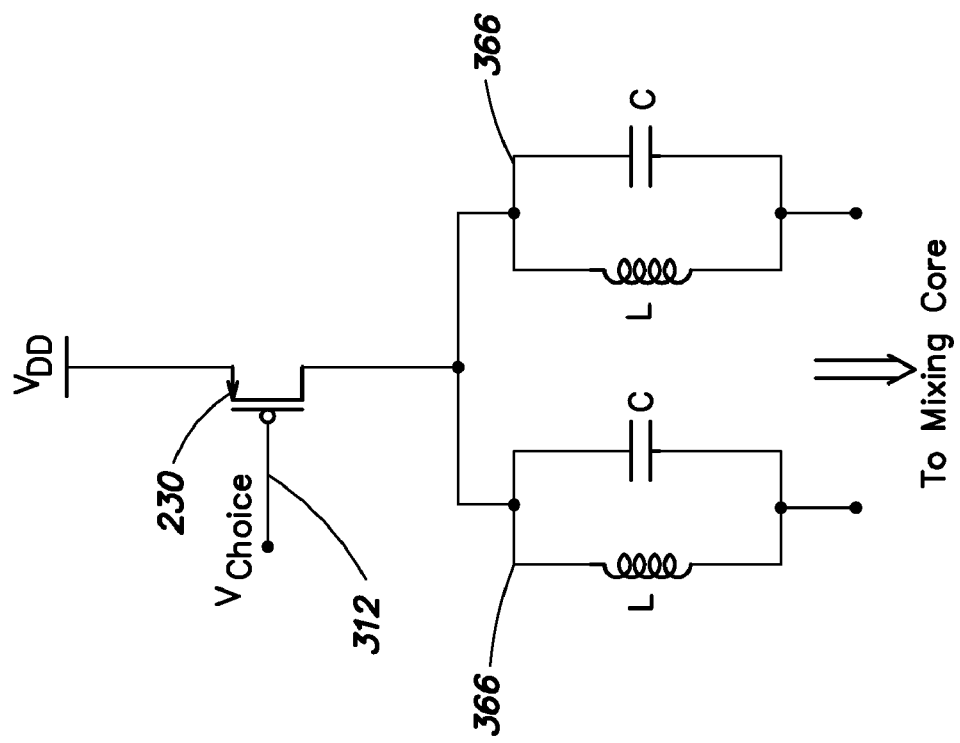
Figure 13A:
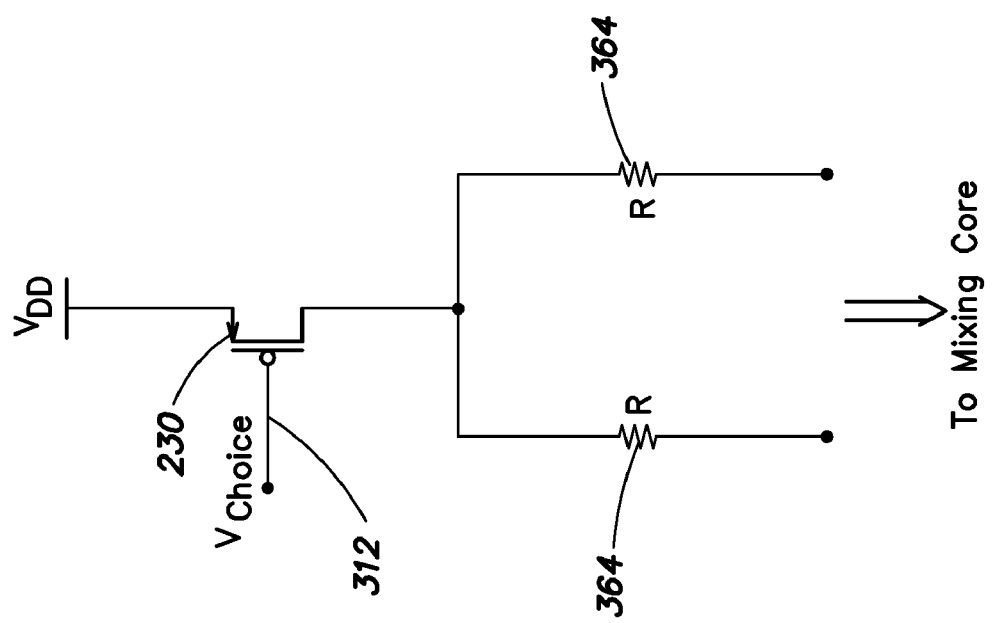
Figure 13D:
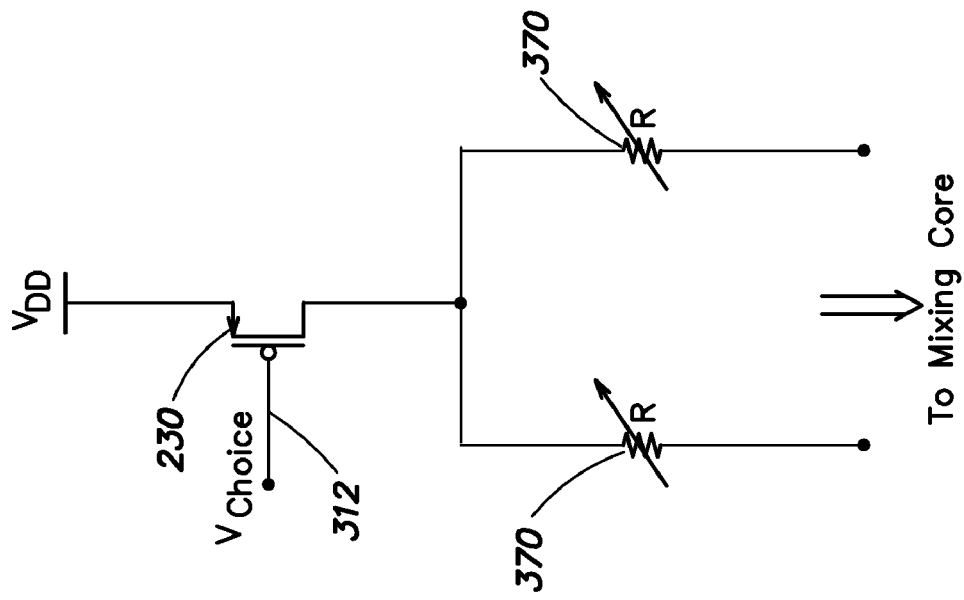
Figure 13C:
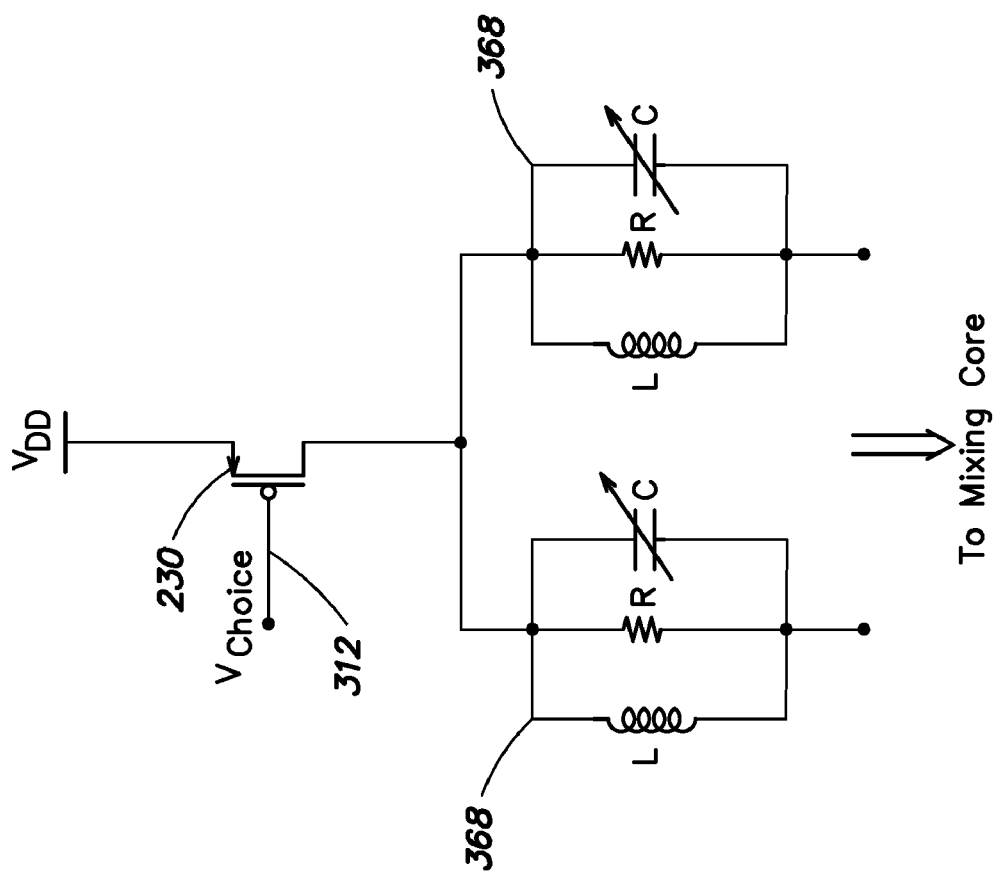

Referring to FIGS. 13A-G, there are illustrated several different embodiments for the load stage 220 when the reconfigurable mixer 202 operates as an active mixer. FIG. 13A illustrates one presently preferred embodiment in which the load stage 220 is a resistive stage, including resistors 364. This exemplary load stage 220 may be advantageous because it is not band limited and therefore, may be very suitable for a multi-band/multi-standard application. FIG. 13B illustrates an example load stage 220 using a resonator configuration including parallel resonators 366. The resonator configuration may be somewhat band-limited. In another example, if an RLC type of load is selected, for example, for multi-standard applications, then a modified resonator configuration 368 using a varactor, as illustrated in FIG. 13C, may be desirable.

Figure 13F:
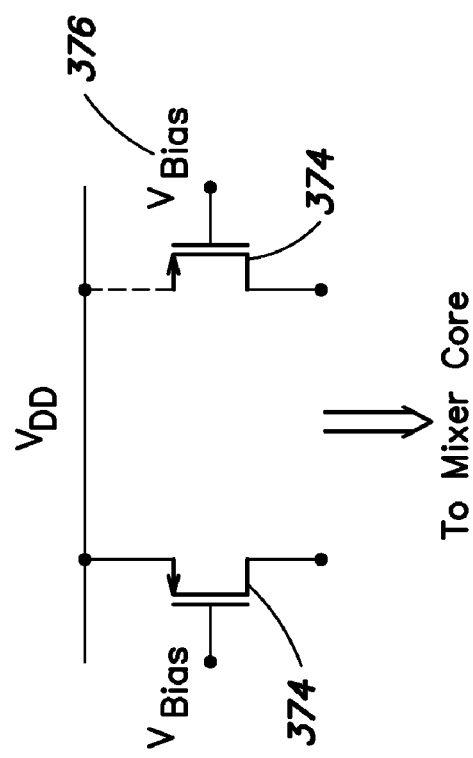
Figure 13E:
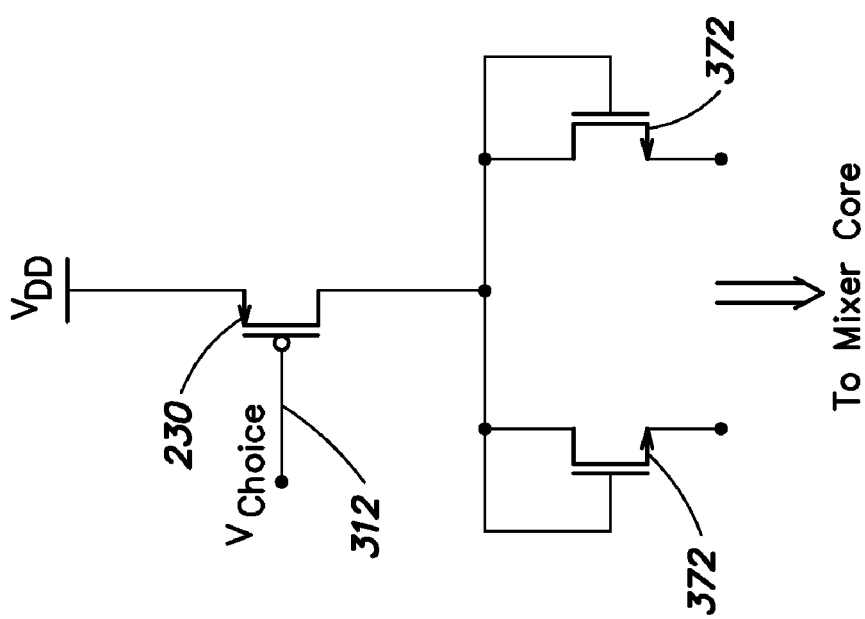

An implementation using a programmable resistance 370, as shown in FIG. 13D, is another approach that can be taken in controlling the voltage conversion gain of the reconfigurable hybrid mixer when operating in the active mode, due to the direct correlation between voltage conversion gain and load impedance. Another example of a load stage 220 implemented using a diode-connected transistor 372 is illustrated in FIG. 13E. The diode-connected transistor 372 has the advantage of not limiting the output voltage swing of the reconfigurable mixer 202, due to the minimal voltage drop at the transistor. By choosing the appropriate width of the transistor 372, as discussed above, the impedance can be adjusted to a desired value that will give desired voltage conversion gain. Another example load stage configuration that uses a current source at the load stage 220 is illustrated in FIG. 13F. By changing the bias gate voltage 376 of the transistor 374, the impedance of the load can be adjusted. Referring to FIG. 13G, in another example, using a PMOS bleeder or other current source 378 next to the load impedance 310 that supplies the current to the input (transconductance) stage 224 may be favorable because it can reduce the current flowing through the load impedance 310 and makes the voltage drop across the load stage 220 minimal, causing an increase at the output voltage swing and dynamic range of the reconfigurable mixer 202.

Figure 14:
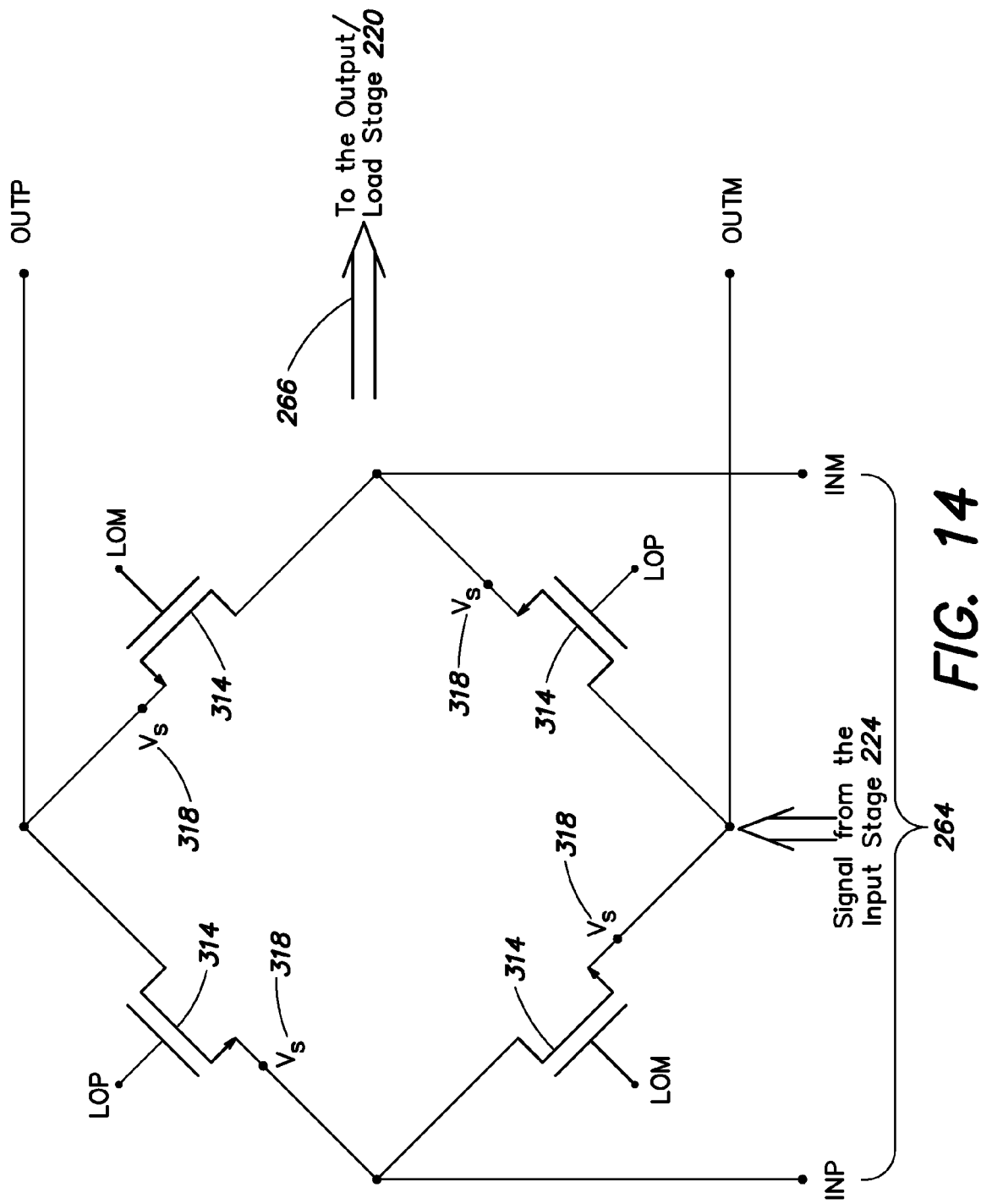
FIG. 14 is a circuit diagram of one example of a mixing core of the reconfigurable mixer according to aspects of the invention.

Referring to FIG. 14, there is illustrated an example of a FET-Quad mixing core that may be used for the mixing core 222 of the reconfigurable mixer 202. The FET-Quad mixing core 222 includes four transistors 314 coupled together as shown in FIG. 14. In one embodiment, the mixing core 222 receives a differential input signal at terminal 264 (INP, INM) from the input stage 224, and provides a differential output signal, either RF or IF (depending on whether the mixer 202 is operating as an up-converter or down-converter) at terminal 266 (OUTP, OUTM) which is fed to the load stage 220. Controllability of the FET-Quad mixing core is provided by adjusting the local oscillator (LOP/LOM) bias voltage or the gate bias voltage that is applied on the transistors 314. In one example, the operating point of the reconfigurable mixer 202 may be controlled by adjusting the LO bias voltage relative to the threshold voltage of the transistor 314. When the voltage $V_{GS}$ of transistor 314 is larger than its threshold voltage, the transistor 314 is turned on. When $V_{GS}$ is smaller than the threshold voltage, the transistor 314 is turned off. In particular, based on the threshold voltage of the transistor 314, the mixing core 222 can be configured to operate with a mixing process that either does overlapping or does not. The term "overlapping" refers to the state when the transistors are biased with $V_{GS}$ that is not equal to the threshold voltage. When the LOP and LOM signals being applied at the gate of transistor 314 are biased at threshold voltage, it is said that the mixer is NOT overlapping. When the LOP and LOM are biased with Vgs above the threshold voltage, then it is said that the mixer is operating with ON overlap, and OFF overlap occurs when Vgs is set to be less than the threshold voltage of the transistor 314.

Figure 15:
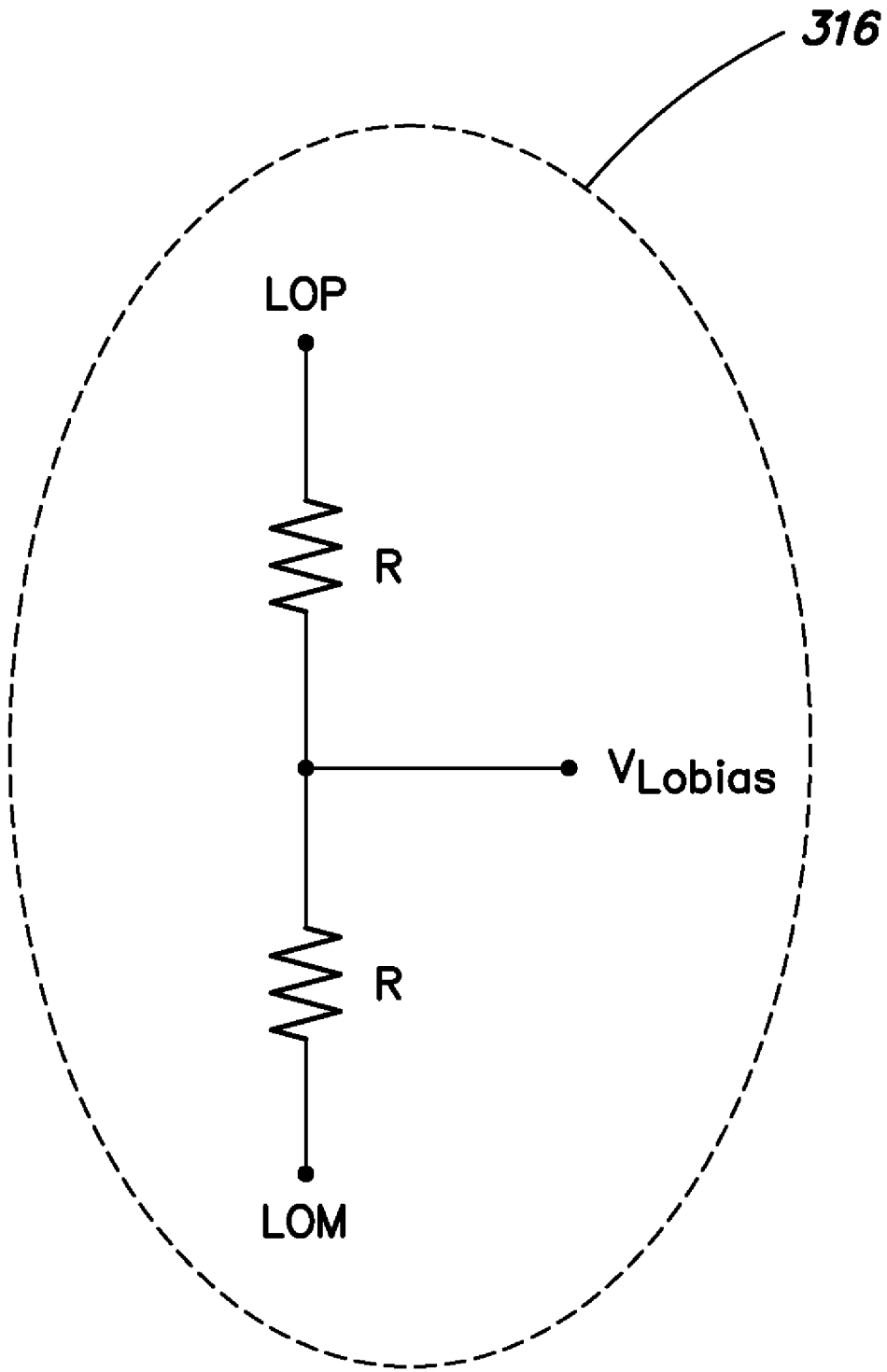
FIG. 15 is a circuit diagram of one example of local oscillator biasing circuitry according to aspects of the invention.

According to one embodiment, using $V_{LOBIAS}$ circuitry 316 illustrated in FIG. 15, the mixing core 222 can be configured to mix with no overlap, ON overlap, or OFF overlap. In one example, $V_{LOBIAS}$, LOP and LOM are all adjustable based on signals from the LO buffer 206. In one example, this $V_{LOBIAS}$ circuitry 316 controls the operating point of the reconfigurable mixer 202. When $V_{LOBIAS}-V_S$ (Vs is the source voltage 318 applied to the transistors 314, as shown in FIG. 14) is approximately equal to the threshold voltage $V_{TH}$ of the NMOS switching devices (i.e., the mixing quad), then the reconfigurable mixer 202 will operate with no overlap. When $V_{LOBIAS}-V_S$ is greater then the threshold voltage $V_{TH}$, the reconfigurable mixer 202 will mix with ON-overlap, and when $V_{LOBIAS}-V_S$ is smaller then the threshold voltage $V_{TH}$, the reconfigurable mixer 202 will mix with OFF-overlap. In one example, the local oscillator bias voltage can be controlled using, for example, an R-2R DAC or other circuitry, that is controlled by the bit settings of the digital control signal supplied by the controller 208 via programming buses 214, 216. When the reconfigurable mixer 202 is operating in the active mode, the operating point may be set based on the drain voltage of the transconductance stage 224 so that the mixing core switches 314 are biased appropriately.

Figure 16:
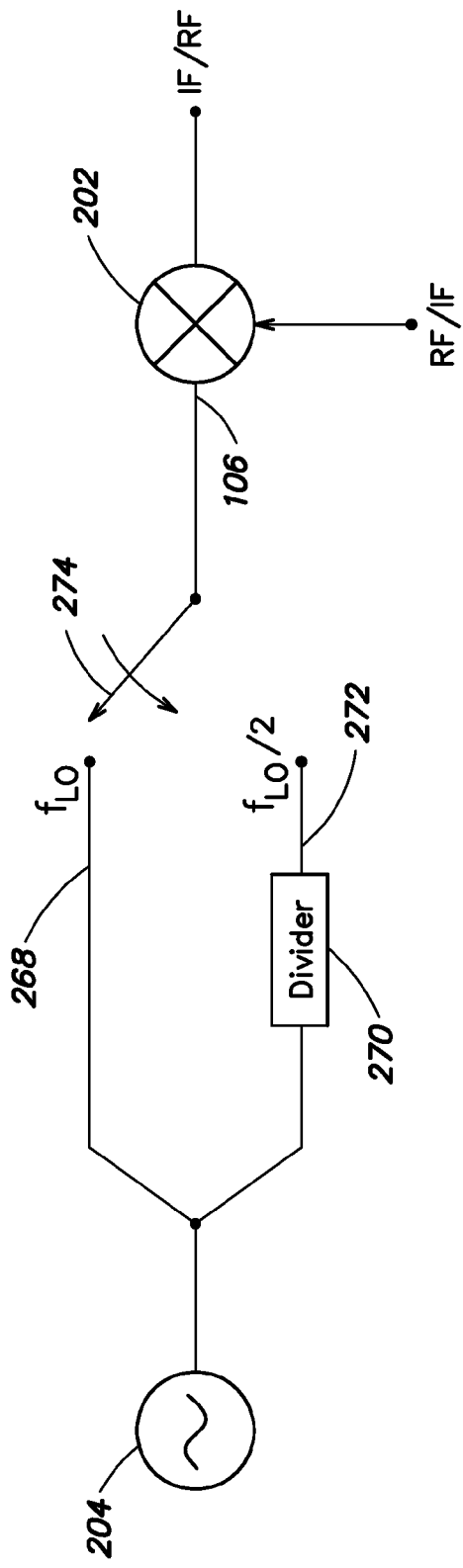
FIG. 16 is block diagram of a portion of an example of the reconfigurable hybrid mixer illustrating configurability between harmonic and sub-harmonic modes of operation of the mixer according to aspects of the invention.

As discussed above, according to one embodiment, the reconfigurable hybrid mixer 200 may operate as either a harmonic mixer or a sub-harmonic mixer. Referring to FIG. 16, there is illustrated an example of the reconfigurable mixer 202 being configurable between harmonic and sub-harmonic operation. The VCO 204 generates a signal with frequency $f_{LO}$ which is provided on line 268. The signal from the VCO 204 may also be divided in half in frequency using a divider 270 to generate a signal with a frequency $f_{LO}/2$ on line 272. A switch 274 may be used to couple either the signal on line 268 or that on line 272 to the LO port 106 of the reconfigurable mixer 202. Based on the settings of the controller 208 and the configuration of the mixer 202, the mixer will operate as a harmonic or a sub-harmonic mixer. For example, the controller 208 may set the local oscillator bias voltage and optionally other bias voltages if needed. The signal applied at the LO port 106 determines the frequency range in which the mixer 202 operates. In one example, when the signal applied at the LO port 106 is $f_{LO}$, the mixer 202 performs harmonic mixing, and when the signal applied at the LO port 106 is $f_{LO}/2$, the mixer 202 operates as a sub-harmonic mixer. One example of a configuration for the mixer 202 is illustrated in FIG. 18 and discussed below; however, it is to be appreciated that various other configurations are possible, as would be recognized by those skilled in the art given the benefit of this disclosure, and the mixer configuration is not limited to the example shown in FIG. 18.

Figure 17:
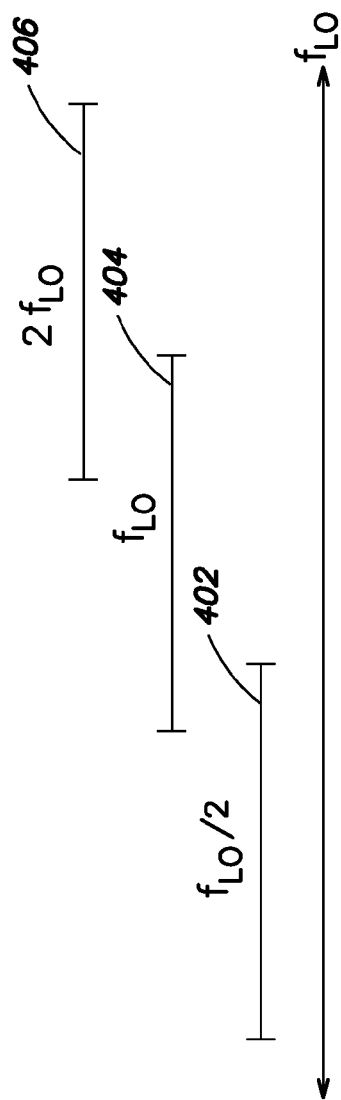
FIG. 17 is a graph illustrating benefits of using a sub-harmonic mixer, such as covering a wide range of frequency with a VCO that only generates half the required maximum frequency.

FIG. 17 is a graph illustrating advantages of using a sub-harmonic mixer, where the frequency $f_{LO}$ may be used to down-convert from, or up-convert to, $f_{RF}$ frequencies that are twice that of the $f_{LO}$ frequency. In this manner, a large range of frequencies can be covered using half of the LO frequency, which allows for a simpler, easier mixer design. For example, consider a radio system in which the radio operates with RF frequencies of 1, 2 and 4 GHz. Using an implementation such as that shown in FIG. 16, one can design a VCO 204 that generates a signal of having a frequency, $f_{LO}$, of 2 GHz which is provided on line 268. The divider 270 can be used to divide that signal by two to generate another signal on line 272 with frequency of 1 GHz. Thus, two of three desired frequencies can be achieved using a harmonic mixer 202 and selecting either the 2 GHz or 1 GHz signal by actuating the switch 274. This will cover the frequencies 402 and 404 illustrated in FIG. 17. To design a 4 GHz VCO is not an easy task; however, by configuring the mixer 202 to operate as a sub-harmonic mixer, the 2 GHz VCO frequency can be doubled to output or sense an RF signal at 4 GHz, as shown by line 406 in FIG. 10. Thus, using just the one VCO signal with frequency $f_{LO}$ frequency, a radio operating at any of 1 GHz, 2 GHZ and 4 GHz can be achieved without any additional VCO design.

Figure 18:
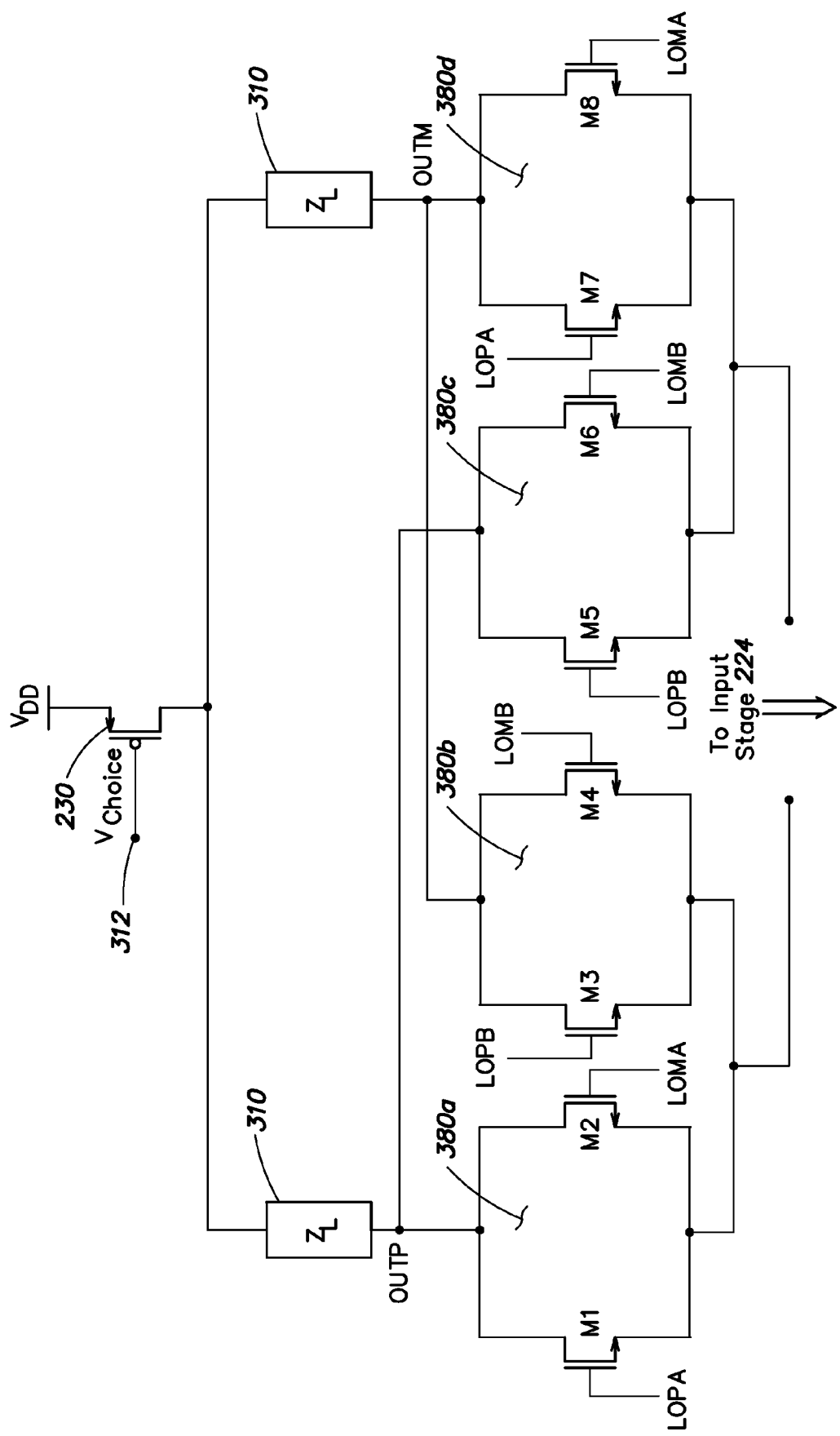
FIG. 18 is a circuit diagram of a portion of the reconfigurable mixer showing the ability to switch between a harmonic and a sub-harmonic mixer according to aspects of the invention.

Referring to FIG. 18 and Table 1 below, there is illustrated an exemplary topology of one embodiment of a sub-harmonic mixer that can be re-configured to operate as a harmonic mixer based on the LO buffer output signals. It will be appreciated by those skilled in the art that numerous other topologies and architectures can be used to implement a sub-harmonic mixer. In the illustrated example, the mixing core 222 topology includes a few extra transistors as compared to a classical mixing core with only four switches. In one example, the LOPA and LOMA signals being 180 degrees apart from each other will cause the core 380a and 380c to double its current switching frequency, thus mixing the signals at twice the LO frequency. The same process of doubling the current switching frequency may occur in the other three cores 380b, 380c, and 380d. In one example, the LOPB and LOMB signals are identical to the LOPA and LOMA signals which get applied to cores 380b and 380d. A downside of this type of architecture is that it reduces the IF-to-RF and/or the RF-to-IF isolation because the current may almost always be flowing through the cores. For this architecture driving the core transistors with a sine wave is currently more advantageous than driving them with a square wave. A benefit of having the LOPB and LOMB additional signals, even though they may be identical to the LOPA and LOMA, is that having the additional signals provides the ability to program the mixer from sub-harmonic to harmonic by simply changing the output of the polyphase VCO—by simply switching the LOPB and LOMA signals ON (sub-harmonic) and OFF (harmonic) as shown in the table below. In order to switch between harmonic and sub-harmonic mixing, the signals fed to the gates of each transistor M1-M8 may be as shown in Table 1 below.

TABLE 1

| HARMONIC | | SUB-HARMONIC | |
|---|---|---|---|
| Transistor | Feed | Transistor | Feed |
| M1 | LOPA | M1 | LOPA |
| M2 | OFF | M2 | LOMA |
| M3 | OFF | M3 | LOPB |
| M4 | LOMB | M4 | LOMB |
| M5 | OFF | M5 | LOPB |
| M6 | LOMB | M6 | LOMB |
| M7 | LOPA | M7 | LOPA |
| M8 | OFF | M8 | LOMA |

Figure 19:
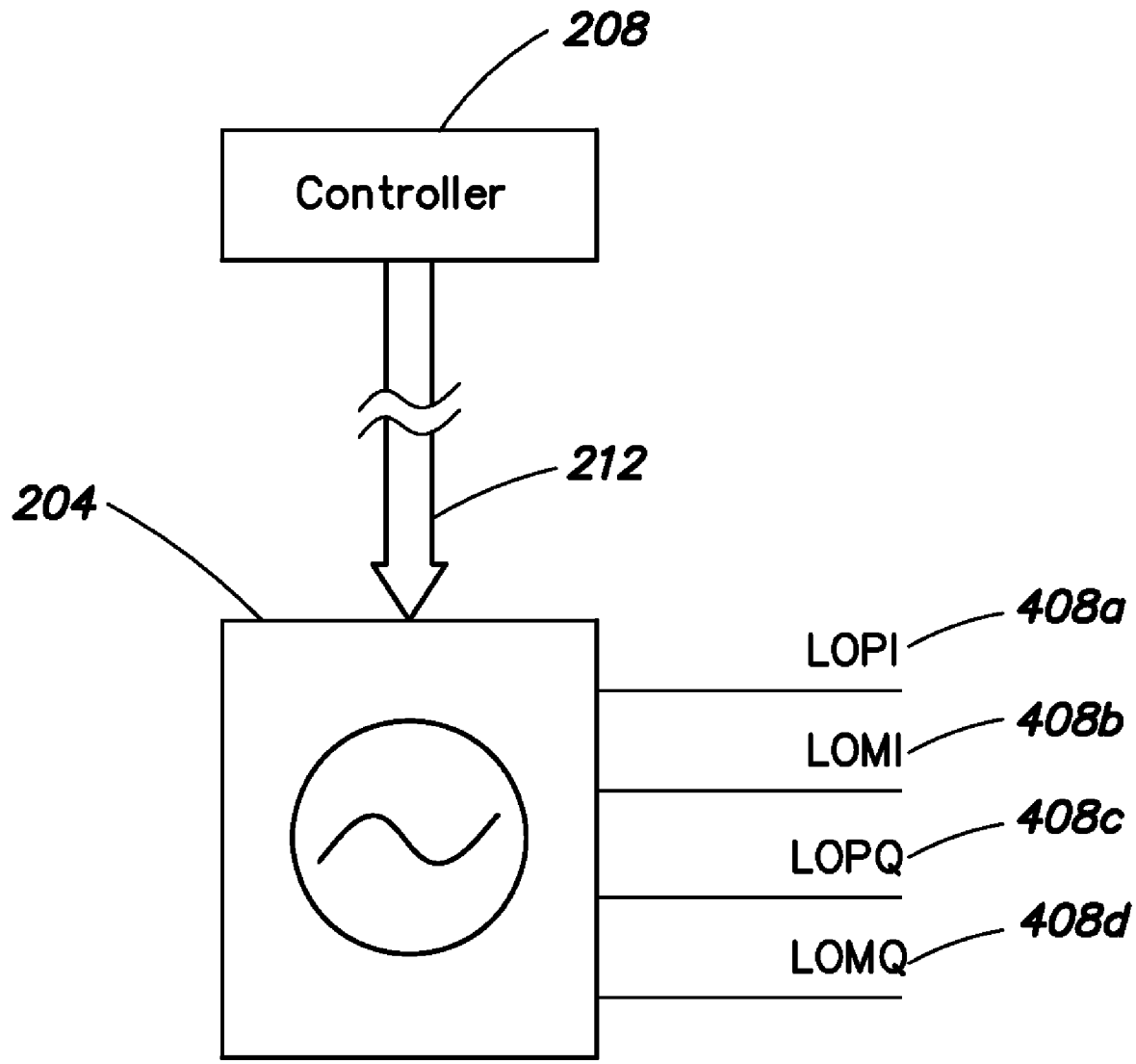
FIG. 19 is a block diagram illustrating an example of the programmable polyphase VCO generating VCO signals for switching between upper and lower sideband modulation operation for an embodiment of the reconfigurable mixer according to aspects of the invention.
Figure 20A:
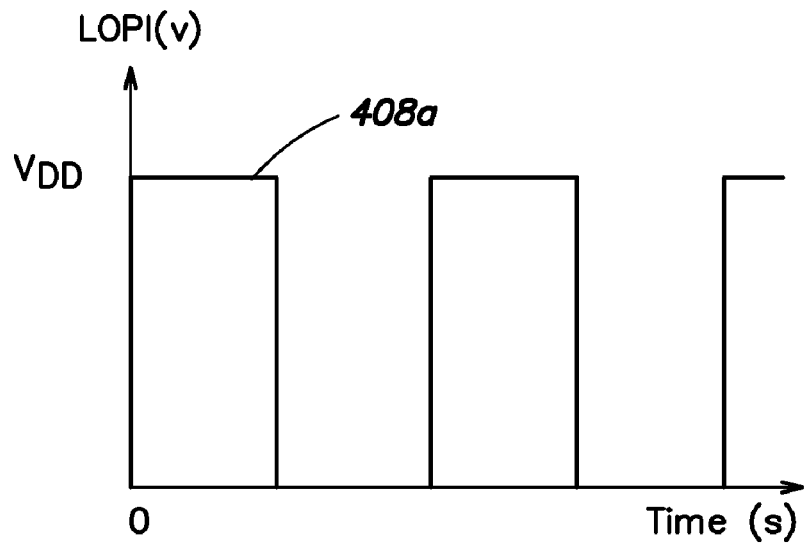
FIGS. 20A-F are graphs illustrating the VCO signals generated to switch between upper and lower side-band modulation, according to aspects of the invention.
Figure 20B:
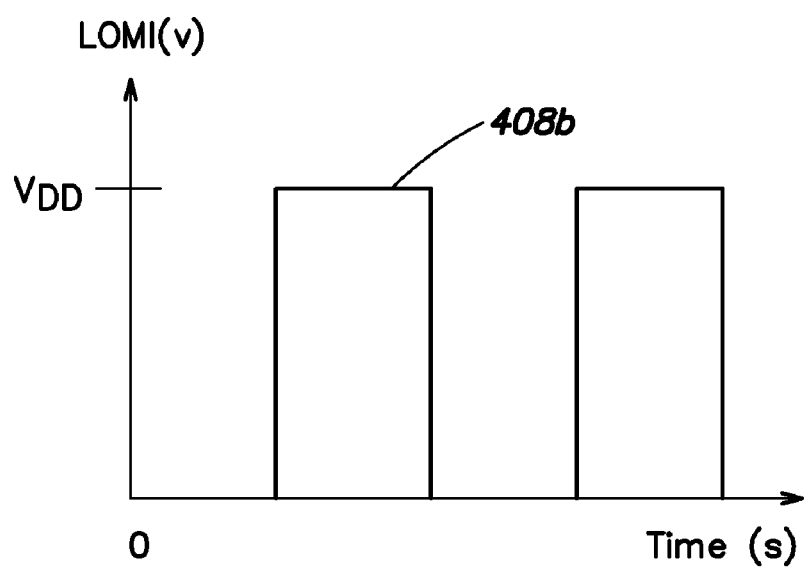
Figure 20C:
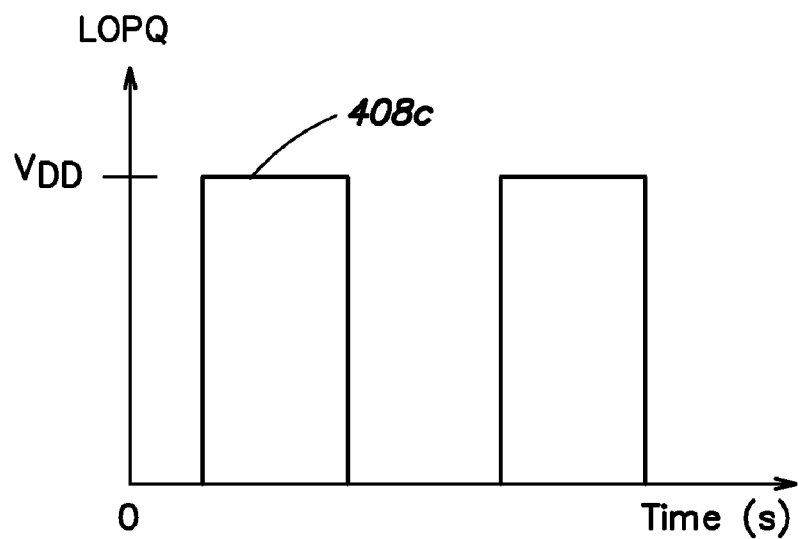
Figure 20D:
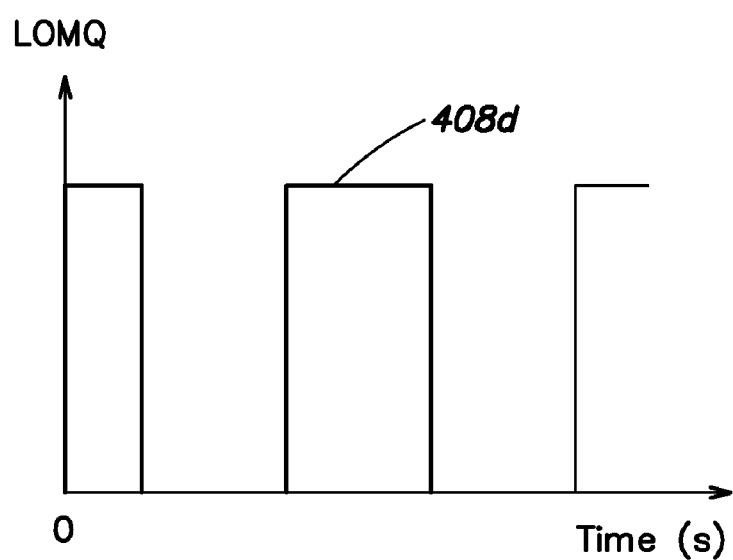
Figure 20E:
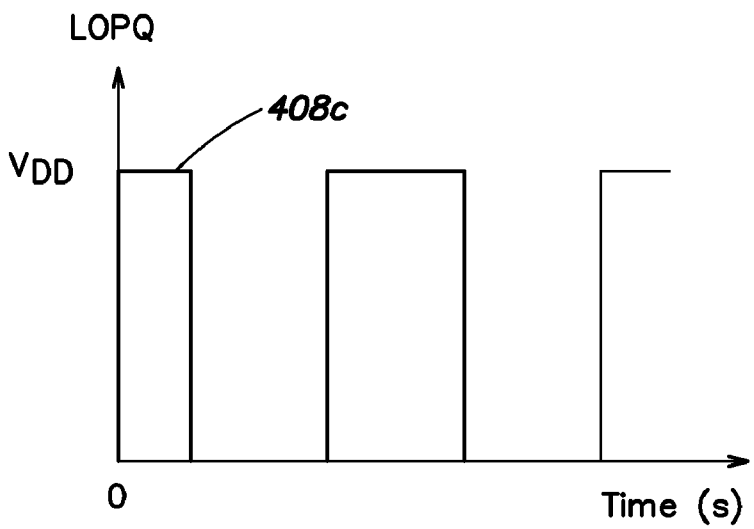
Figure 20F:
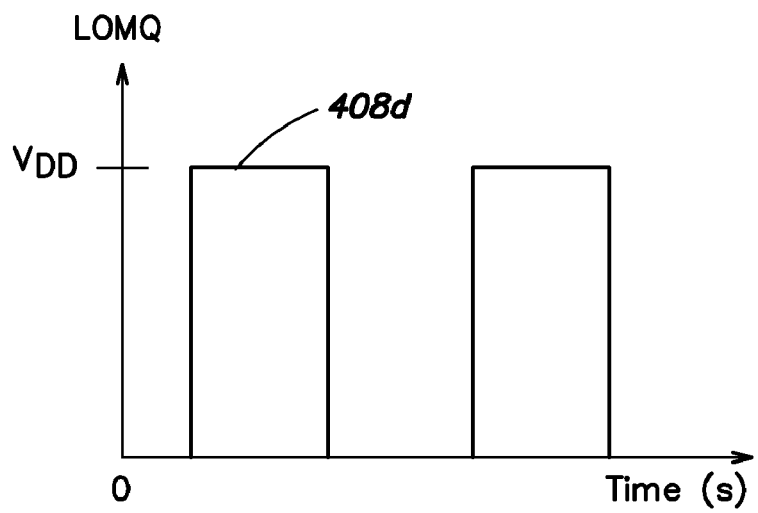

According to another embodiment, the reconfigurable mixer 202 may perform upper and/or lower sideband modulation. Referring to FIG. 19, (and again to FIG. 2), the polyphase VCO 204 may be configured such that it is able to output four signals 408a-d at different phases as programmed by the controller 208. To convert between the upper and lower sideband modulation, the reconfigurable mixer 202 may be operated as a quadrature I/Q mixer. In one example, the signals 408a (illustrated in FIG. 20A) and 408b (illustrated in FIG. 20B) are fed to an I-channel mixer, and are 180 degrees apart in phase from one other. In a first example, the signals 408c and 408d may be made 90 degrees apart in phase from the signals 408a and 408b, respectively, as can be seen with reference to FIGS. 20A-D, and fed to the Q-channel mixer. In this example, the reconfigurable mixer 202 will modulate the signal in the lower sideband. Alternatively, the controller 208 may program to the VCO 204 to generate the signals 408c and 408d in the Q-channel 270 degrees apart in phase from the signals 408a and 408b, respectively, as shown by comparing FIGS. 20A, 20B, 20E and 20F, to configure the mixer to modulate the signal in the upper sideband. Thus, the reconfigurable mixer 202 may be programmed to perform upper or lower sideband modulation simply by programming the phase of the signals generated by the VCO 204. This may allow flexible mixer operation with no additional circuitry.

Figure 21A:
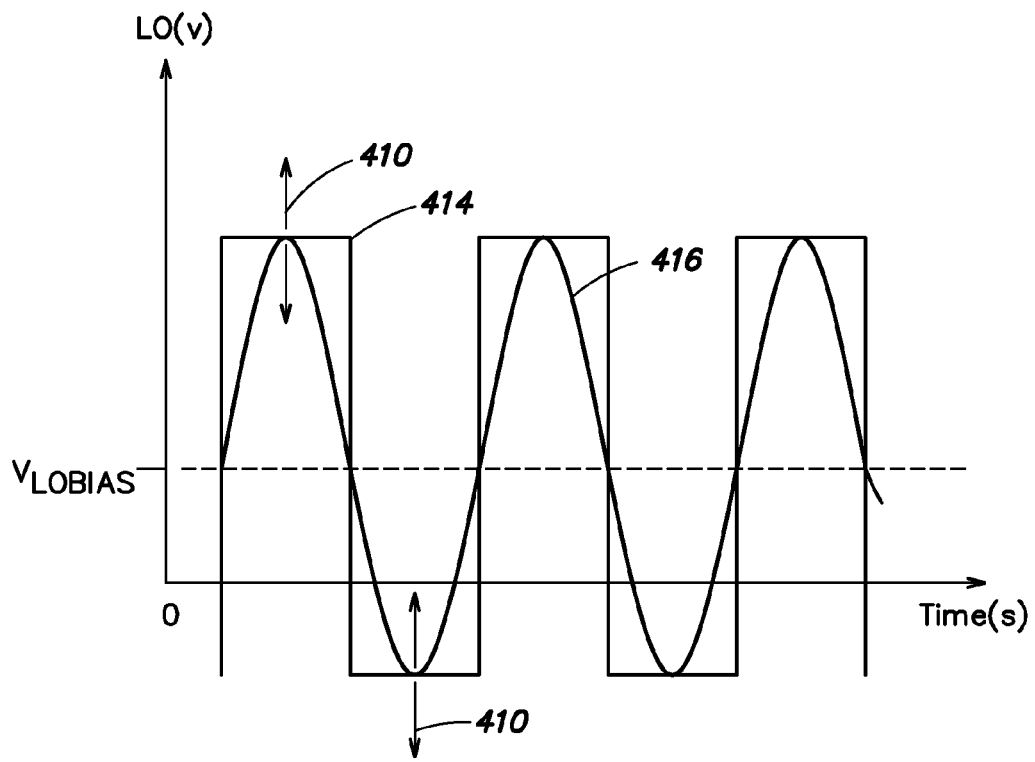
FIG. 21A is a graph of an example of the LO drive signal over time.
Figure 21B:
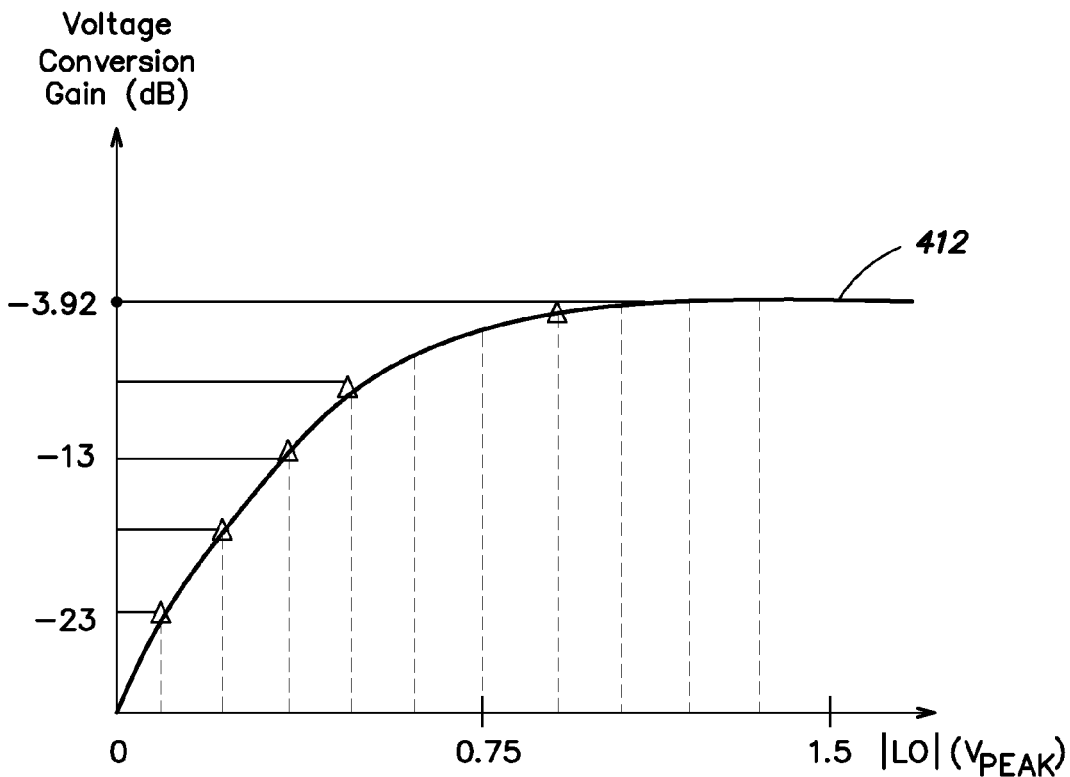
FIG. 21B is a graph of voltage conversion gain as a function of the LO drive strength for an example of the reconfigurable hybrid mixer according to aspects of the invention.

According to another embodiment, the voltage conversion gain of the reconfigurable hybrid mixer 200 may be controlled based on the LO drive strength. An example of this controllability of the voltage conversion gain based on LO drive strength is shown with reference to FIGS. 2, 21A and 21B. As the amplitude 410 of the LO buffer 206 signal is adjusted (as shown in FIG. 21A), the gain 412 of the mixer also changes. As shown in FIG. 21B, the stronger the LO drive signal, the higher the conversion gain 412 of the mixer. Referring again to FIG. 21A, there is illustrated both an example of an ideal 414 drive signal and a sinusoidal 416 drive signal of the LO buffer 206. The difference between the ideal signal 414 and the sinusoidal signal 416 is that with a perfect square wave (414) the amount of noise that the reconfigurable mixer 202 will generate during passive operation may be minimal, whereas with the sinusoidal signal 416, noise may be injected between the ON and OFF states of the mixing core switches. It will be appreciated by those skilled in the art that the LO buffer 206 may have gain control can be designed in many different ways. According to one embodiment, using the LO buffer amplitude and the LO bias voltage as control signals, the mixer 202 can be turned OFF by setting the LO buffer amplitude and LO bias voltage to zero, thereby turning the NMOS switches in the mixing core 222 completely OFF.

Figure 22:
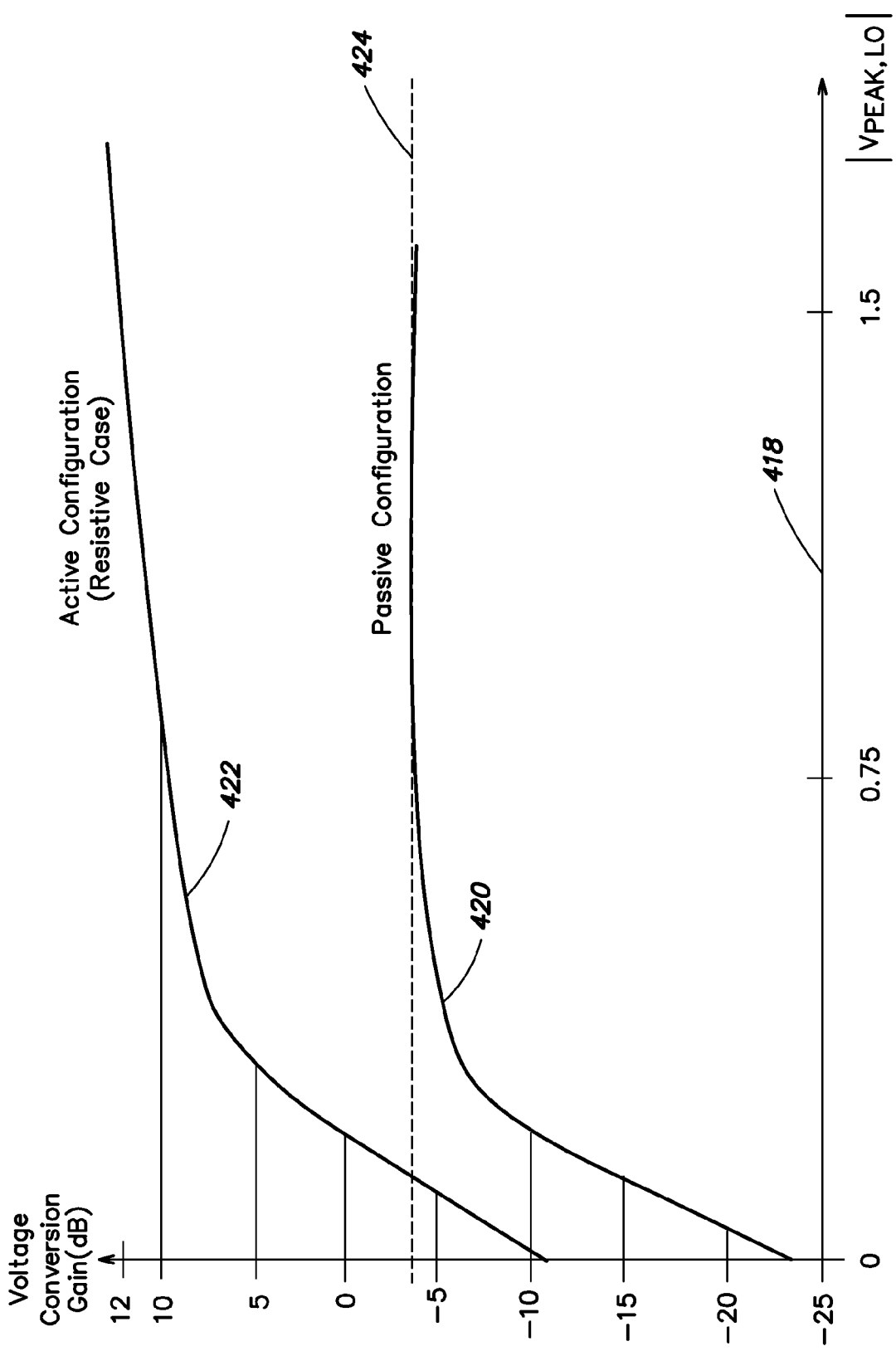
FIG. 22 is a graph illustrating controllability of the voltage conversion gain of an example of the reconfigurable hybrid mixer as a function of the LO drive strength.

Referring to FIG. 22, there is illustrated a graph showing the voltage conversion gain controllability of the reconfigurable hybrid mixer 200 based on the LO drive strength for an example of each of the active and passive configurations. As can be seen in FIG. 22, as the amplitude of the LO buffer 206 is adjusted (along the horizontal axis 418) the gain 420 (passive configuration) and 422 (active configuration using a resistive load stage 220) of the reconfigurable hybrid mixer 200 also changes. The stronger the LO drive, the higher the voltage conversion gain of the mixer. In one example, the ideal voltage conversion gain of the passive mixer, indicated by line 424, is given by:

$$20\log_{10}\left(\frac{2}{\pi}\right) = -3.92 \text{ dB} \quad (12)$$

In the active configuration, the voltage conversion gain depends on the transconductance and the load impedance of the reconfigurable mixer 202. To generate the example gain 422, the active mixer configuration included a resistive load of 100 Ohms.

Figure 23:
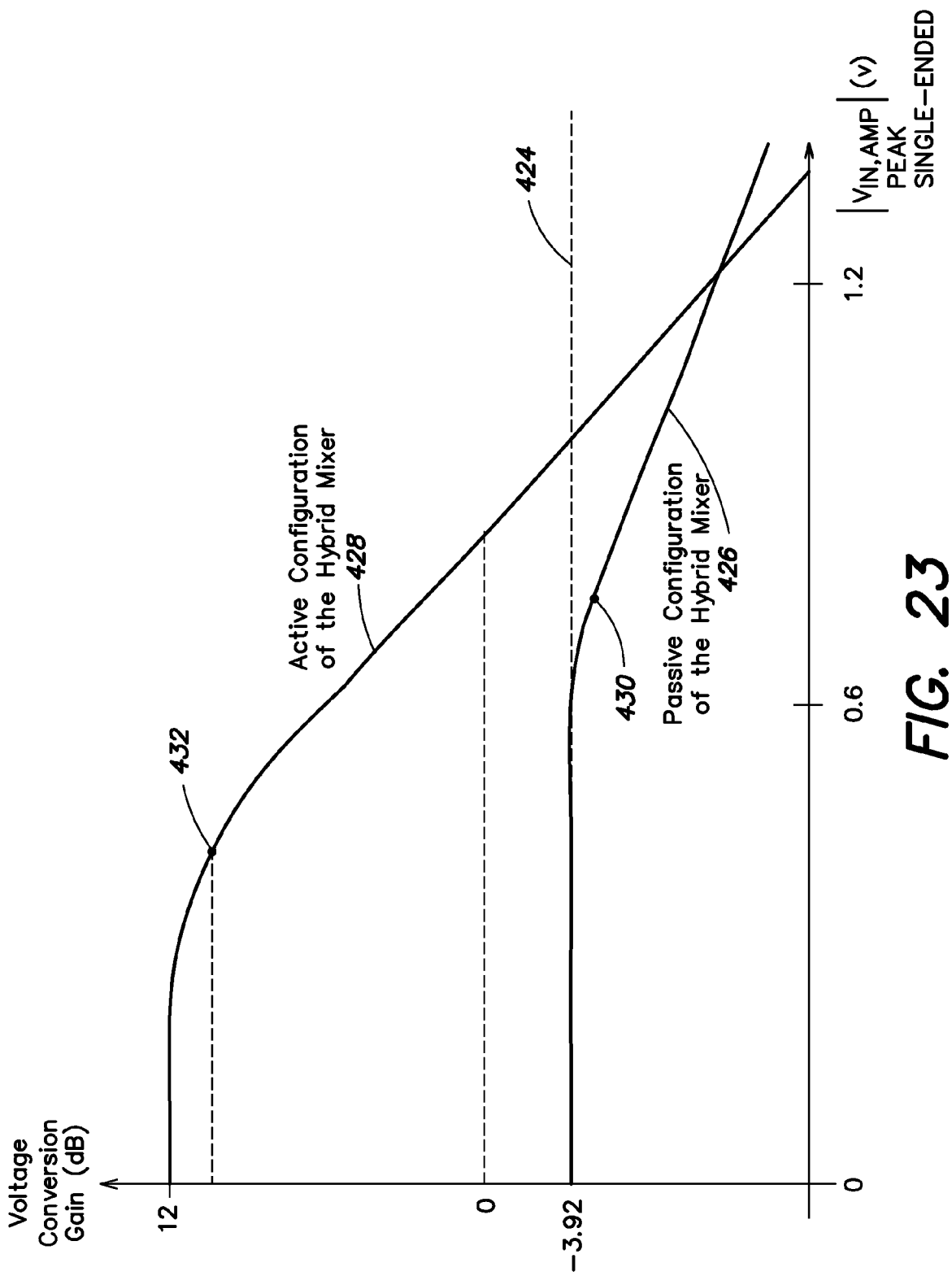
FIG. 23 is a graph illustrating an example of the voltage conversion gain for the reconfigurable hybrid mixer while operating in active and passive mode respectively.

Referring to FIG. 23, there is illustrated another example of the voltage conversion gain for both passive (line 426) and active (line 428) configurations of the reconfigurable hybrid mixer 200. The ideal voltage conversion gain 424 of the passive mixer configuration due to switching of the transistors is also illustrated. In one example, the 1-dB compression point 430 of the passive mixer is much greater than the 1-dB compression point 432 of the active mixer. This difference is due to the operating points of the passive mixer and due to 1-dB compression only being dependent on the LO voltage swing that switches the mixing core, whereas in the active configuration, the transconductance/input stage 224 and the load stage 220 limit the input and output voltage swings significantly, causing a much smaller 1-dB compression point 432. According to some examples, various embodiments of the input stage 224 discussed above can improve the overall linearity of the reconfigurable mixer 200.

Figure 24:
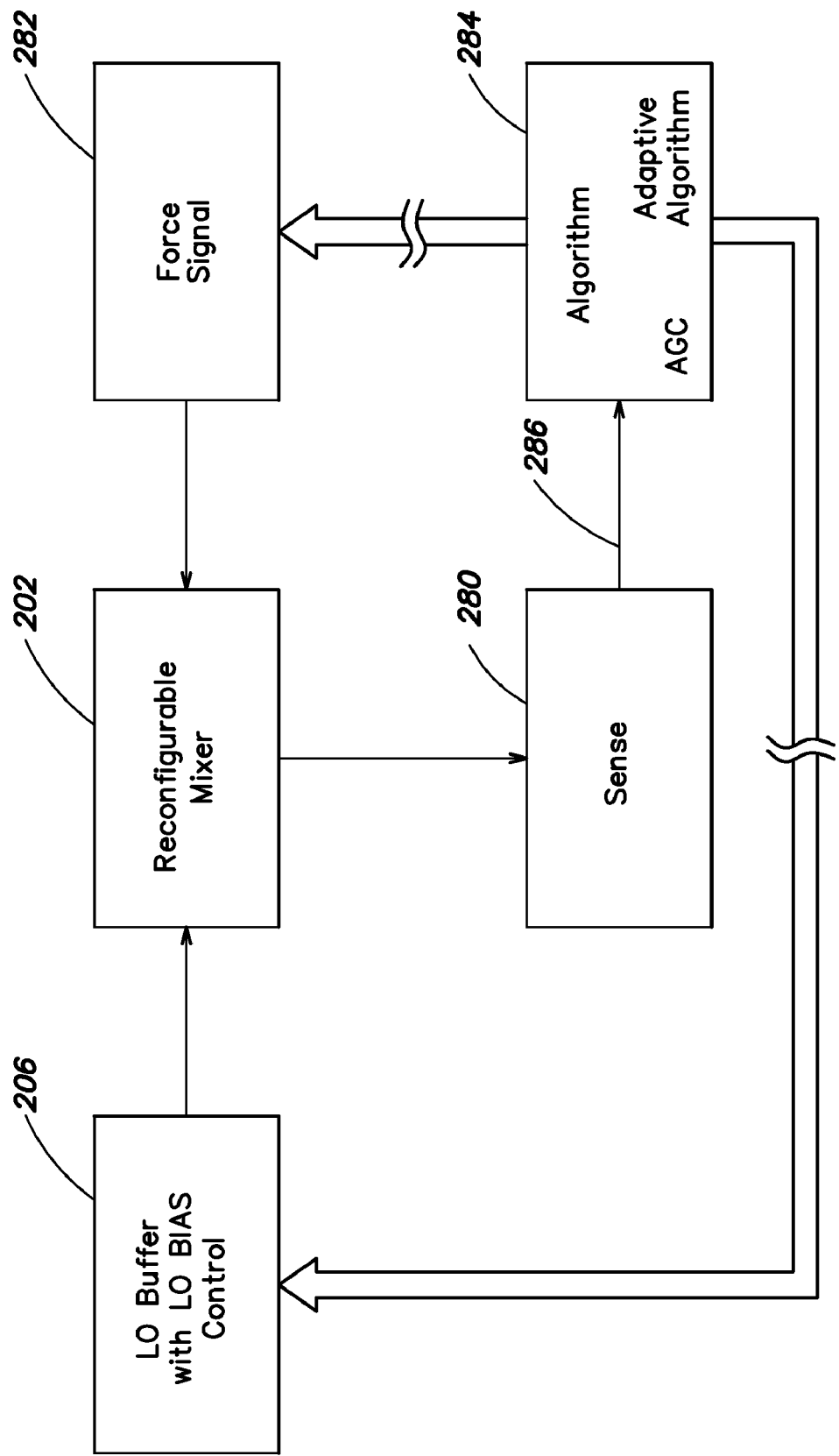
FIG. 24 is a block diagram of one example of an automatic gain control loop for the reconfigurable hybrid mixer according to aspects of the invention.

According to another embodiment, the reconfigurable hybrid mixer includes an automatic gain control feature. A block diagram one of example of an automatic gain control (AGC) loop for the reconfigurable hybrid mixer 200 is illustrated in FIG. 24. In the illustrated example, the AGC loop includes the reconfigurable mixer 202, the LO buffer 206, a sensing unit 280, a force signal generator 282, the LO buffer 206, and an algorithm 284 that is used to adjust the LO Buffer 206. The algorithm 284 may automatically control the gain based on the strength of the input signal (on line 286) from the sensing unit 280 and the change of the LO drive strength that ultimately affects the voltage conversion gain of the mixer 202. In one embodiment, the algorithm 284 takes the sensed signal (on line 286) and adjusts the settings of the LO Buffer 206 based on sensed signal. The LO Buffer 206 signal strength can be controlled in various ways. For example, a control signal from the controller 208 can be supplied via the programming bus 214, discussed above, and be converted using an R-2R DAC (or other circuitry) to control the voltage or the current of the LO Buffer 206. By changing the supply voltage of the LO Buffer 206, the strength of the LO Buffer 206 may be easily controlled. In another example, automatic gain control can be achieved by using the force signal generator 282, which can be adjusted by the algorithm block 284 that changes based on the information from the sense block 280. The algorithm block 284 may be part of the controller 208 or may be separate/external component.

Embodiments of a reconfigurable hybrid mixer that is programmable for active and passive operation, different operating points, harmonic or sub-harmonic operation, and upper and/or lower sideband modulation have been described. As discussed above, such a reconfigurable hybrid mixer may be useful for applications where divergent system parameters (for example, when compared across different modes or frequency bands) cause difficulty in selecting a single mixer type, such as multi-band and/or multi-mode transceiver systems. In addition, there are several "single function" applications that may also benefit from the flexibility offered by a reconfigurable hybrid mixer. For example, considering the dynamic operation of a radio receiver, in some instances as the blocker power is increased (or decreased) relative to the signal power, it may be advantageous to have the ability to dynamically change the mixer type and operation. Using a reconfigurable hybrid mixer according to aspects of the invention, a receiver link may be dynamically optimized for various metrics, including, for example, power efficiency and signal-to-noise ratio, by dynamically reconfiguring the mixer for different modes of operation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A reconfigurable hybrid frequency mixer comprising:
a programmable input stage configured to receive an input signal;
a programmable mixing core coupled to the input stage and configured to receive the input signal and a local oscillator signal and to generate a mixed signal;
a load stage coupled to the mixing core and configured to receive the mixed signal and provide an output signal; and
a first switch coupled to the load stage and configured to be actuated by a control signal to couple the load stage to a supply voltage terminal in an active mode of the reconfigurable hybrid frequency mixer and to couple the load stage to a floating terminal in a passive mode of the reconfigurable hybrid frequency mixer;
wherein the input stage comprises a transistor circuit having a cascode configuration and a bypass switch;
wherein, in the passive mode, wherein the transistor circuit and the bypass switch are configured so that the bypass switch is actuated to bypass the transistor circuit; and
wherein the transistor circuit has one of a folded-up cascode configuration and a folded-down cascode configuration.

2. A reconfigurable hybrid frequency mixer comprising:
a programmable input stage configured to receive an input signal;
a programmable mixing core coupled to the input stage and configured to receive the input signal and a local oscillator signal and to generate a mixed signal;
a load stage coupled to the mixing core and configured to receive the mixed signal and provide an output signal;
a first switch coupled to the load stage and configured to be actuated by a control signal to couple the load stage to a supply voltage terminal in an active mode of the reconfigurable hybrid frequency mixer and to couple the load stage to a floating terminal in a passive mode of the reconfigurable hybrid frequency mixer;
a local oscillator that generates a local oscillator signal;
a frequency divider coupled to the local oscillator and configured to generate a divider signal that has a frequency of about half that of the local oscillator signal; and
a second switch connected between the mixing core, the frequency divider and the local oscillator and configured to selectively couple one of the local oscillator signal and the divider signal to the mixing core, to reconfigure the reconfigurable hybrid frequency mixer between a harmonic mode and a sub-harmonic mode.

3. A reconfigurable hybrid frequency mixer comprising:
a programmable input stage configured to receive an input signal;
a programmable mixing core coupled to the input stage and configured to receive the input signal and a local oscillator signal and to generate a mixed signal;
a load stage coupled to the mixing core and configured to receive the mixed signal and provide an output signal;
a first switch coupled to the load stage and configured to be actuated by a control signal to couple the load stage to a supply voltage terminal in an active mode of the reconfigurable hybrid frequency mixer and to couple the load stage to a floating terminal in a passive mode of the reconfigurable hybrid frequency mixer; and
a local oscillator that generates a local oscillator signal, and a controller;
wherein the mixing core comprises a plurality of transistors; and
wherein the controller reconfigures the reconfigurable hybrid frequency mixer between a harmonic mode and a sub-harmonic mode by selectively turning off some of the plurality of transistors and by selectively controlling a phase of the local oscillator signal fed to the mixing core.

4. The reconfigurable hybrid frequency mixer as claimed in claim 3, wherein the load stage comprises a resonance circuit including an inductor coupled in parallel with a capacitor.

5. The reconfigurable hybrid frequency mixer as claimed in claim 3, wherein the reconfigurable hybrid frequency mixer is further configurable between mixing with no overlap, mixing with on-overlap and mixing with off-overlap by adjusting a bias voltage at a gate of at least some of the plurality of transistors of the mixer core.

6. The reconfigurable hybrid frequency mixer as claimed in claim 5, wherein the controller reconfigures the reconfigurable hybrid frequency mixer between upper sideband modulation and lower sideband modulation by selectively controlling the phase of the local oscillator signal provided at the gate of the at least some of the plurality of transistors of the mixer core.

* * * * *